United States Patent
Jun et al.

(10) Patent No.: US 10,680,586 B2
(45) Date of Patent: Jun. 9, 2020

(54) SPREAD SPECTRUM CLOCK GENERATION APPARATUS AND METHOD, AND DISPLAY DEVICE AND TOUCH DISPLAY DEVICE

(71) Applicant: LG DISPLAY CO., LTD., Seoul (KR)

(72) Inventors: Jaehun Jun, Paju-si (KR); Hyunkyu Park, Paju-si (KR)

(73) Assignee: LG DISPLAY CO., LTD., Soeul (KR)

( * ) Notice: Subject to any disclaimer, the term of this patent is extended or adjusted under 35 U.S.C. 154(b) by 0 days.

(21) Appl. No.: 16/208,761

(22) Filed: Dec. 4, 2018

(65) Prior Publication Data
US 2019/0173454 A1 Jun. 6, 2019

(30) Foreign Application Priority Data

Dec. 6, 2017 (KR) .......... 10-2017-0167055

(51) Int. Cl.
*H03K 3/013* (2006.01)
*H03L 7/08* (2006.01)
(Continued)

(52) U.S. Cl.
CPC .............. *H03K 3/013* (2013.01); *G06F 1/08* (2013.01); *G06F 3/0418* (2013.01); *G09G 3/2096* (2013.01); *G09G 3/3225* (2013.01); *G09G 3/3648* (2013.01); *H03L 7/0802* (2013.01); *H03L 7/1072* (2013.01); *H03L 7/1075* (2013.01); *G06F 3/044* (2013.01); *G06F 3/04184* (2019.05); *G09G 5/008* (2013.01); *G09G 2310/0264* (2013.01); *G09G 2310/08* (2013.01); *G09G 2330/06* (2013.01); *G09G 2354/00* (2013.01)

(58) Field of Classification Search
CPC ......... H03K 3/013; G06F 1/08; G06F 3/0418; G06F 3/2096; G06F 3/3225; G06F 3/3648; G06F 3/04184; G06F 3/044; H03L 7/0802; H03L 7/1072; H03L 7/1075; G09G 5/008; G09G 2310/0264; G09G 2310/08; G09G 2330/06; G09G 2354/00
USPC ........................................................ 345/204
See application file for complete search history.

(56) References Cited

U.S. PATENT DOCUMENTS 7,389,095 B1 * 6/2008 Liu .................. H04B 15/02
331/16
8,254,430 B1 * 8/2012 Venugopal ................ H03L 7/06
318/606

(Continued)

*Primary Examiner* — Mark Edwards
(74) *Attorney, Agent, or Firm* — Polsinelli PC

(57) ABSTRACT

A spread spectrum clock generation apparatus includes a frequency modulator configured to generate an output clock signal, a frequency of which is variable with reference to a predetermined center frequency, by frequency-modulating an input clock signal according to a modulation profile signal; and a profile generator configured to generate a nested-modulation profile for controlling the frequency of the output clock signal, generate the modulation profile signal according to the nested-modulation profile, and output the modulation profile signal to the frequency modulator, wherein the profile generator is further configured to generate the nested-modulation profile by varying a cycle and a change range of a triangle modulation profile having a triangle waveform pattern having a pre-designated cycle and a pre-designated amplitude with reference to the center frequency in a time-frequency domain.

15 Claims, 12 Drawing Sheets

(51) Int. Cl.

| | |
|---|---|
| *H03L 7/107* | (2006.01) |
| *G09G 3/3225* | (2016.01) |
| *G09G 3/36* | (2006.01) |
| *G06F 3/041* | (2006.01) |
| *G06F 1/08* | (2006.01) |
| *G09G 3/20* | (2006.01) |
| *G06F 3/044* | (2006.01) |
| *G09G 5/00* | (2006.01) |

(56) References Cited

U.S. PATENT DOCUMENTS

| | | | |
|---|---|---|---|
| 2004/0136440 A1* | 7/2004 | Miyata | H03C 3/095 |
| | | | 375/130 |
| 2006/0176933 A1* | 8/2006 | Uemura | H03C 3/0925 |
| | | | 375/130 |
| 2016/0203802 A1* | 7/2016 | Hong | G09G 5/006 |
| | | | 345/534 |
| 2016/0266716 A1* | 9/2016 | Kim | G06F 3/0418 |

* cited by examiner

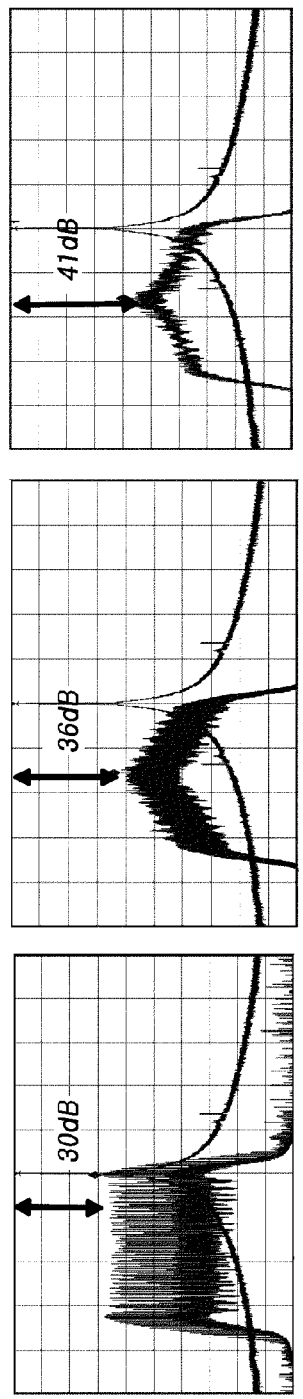

SPREAD SPECTRUM CLOCK GENERATION APPARATUS AND METHOD, AND DISPLAY DEVICE AND TOUCH DISPLAY DEVICE

CROSS REFERENCE TO RELATED APPLICATION

This application claims priority from Korean Patent Application No. 10-2017-0167055, filed on Dec. 6, 2017, which is hereby incorporated by reference in its entirety for all purposes as if fully set forth herein.

BACKGROUND

Field of the Disclosure

The present disclosure relates to a spread spectrum clock generation apparatus and a spread spectrum clock generation method, and a display device and a touch display device using the same.

Description of the Background

With the advancement of the information-oriented society and required technology, the amount of data that various electronic devices need to process has rapidly increased, and thus, the operation speeds of various electronic devices have become higher.

A rise in the speed of electronic devices according to an increase in the amount of data not only signifies a rise in the rate at which data is transmitted/received between the electronic devices, but also signifies a rise in the rates at which data is transmitted/received and is processed between various apparatuses within an electronic device.

Also, an electronic device that processes data at a high rate typically generates a clock signal having a high frequency, and performs a designated operation according to the generated clock signal.

However, a high-frequency clock signal which is a regularly generated may cause ElectroMagnetic Interference (EMI). EMI may cause malfunctions of nearby circuits and devices. Accordingly, electronic devices operating at high speeds require methods for reducing EMI.

Among such various methods for reducing EMI, a method known as being representative is a spread spectrum clock generation method for modulating the frequency of a clock signal by using a modulation profile, characterized by a modulation ratio (or a spread ratio) $\delta$ and a modulation frequency $f_m$, and reducing a power density for each frequency of an output signal.

A Spread Spectrum Clock Generator (SSCG) is known as a method which can effectively reduce EMI by spreading a spectrum of the frequency of an output signal and reducing the power density of the frequency thereof. The SSCG is not only applied to a high-speed interface between apparatuses within an electronic device, is but also widely used for communication between electronic devices and the like.

Particularly, an SSCG is recently used for flat panel display devices and the like which have been implemented to have higher resolutions and larger sizes. Recently, various types of display devices, such as Liquid Crystal Display Devices (LCDs), Plasma Display Panel (PDP) Devices, and Organic Light-Emitting Display Devices (OLEDs), are utilized as flat panel display devices.

The trend in which the plane display devices have higher resolutions requires the transmission of a large amount of image data and a currently-commercialized 4K Ultra-High Definition (UHD) display device requires a data transfer rate of 12 Gbps, and a 8K UHD display device to be used afterwards requires a data transfer rate of 120 Gbps.

In addition, the trend in which the plane display devices have larger sizes, causes the length of a line path within a display device to become longer and requires a short rising transition time or a short falling transition time, and thus may cause the radiation of a larger amount of electromagnetic waves.

In order to reduce EMI which may occur due to such conditions, currently, an SSCG has gradually and widely been applied to display devices.

As modulation profiles for modulating the frequency of a clock signal, an SSCG typically may use a sine wave modulation profile, a triangle modulation profile, and a Hershey-Kiss modulation profile, and the like.

Among them, the Hershey-Kiss modulation profile is advantageous in that the power density of a modulated clock signal appears to be relatively uniform, but disadvantageous in that a configuration of the Hershey-Kiss modulation profile is complex.

In contrast, each of the sine wave modulation profile and the triangle modulation profile are disadvantageous in that a power density for each frequency at the maximum spread frequency of a modulated clock signal appears to be greater than the average power density value. That is, a reduction in EMI is limited.

SUMMARY

With this background, an aspect of the present disclosure is to provide a spread spectrum clock generation apparatus and a spread spectrum clock generation method, and a display device and a touch display device using the same which can reduce EMI.

Another aspect of the present disclosure is to provide a spread spectrum clock generation apparatus and a spread spectrum clock generation method, and a display device and a touch display device using the same which during transmission of data, can reduce EMI without increasing the capacity of a buffer memory.

Still another aspect of the present disclosure is to provide a spread spectrum clock generation apparatus and a spread spectrum clock generation method, and a display device and a touch display device using the same which during transmission of data, can reduce EMI without increasing jitter.

In accordance with an aspect of the present disclosure, there may be provided a spread spectrum clock generation apparatus including: a frequency modulator configured to generate an output clock signal, a frequency of which is variable with reference to a predetermined center frequency, by frequency-modulating an input clock signal according to a modulation profile signal; and a profile generator configured to generate a nested-modulation profile for controlling the frequency of the output clock signal, generate the modulation profile signal according to the nested-modulation profile, and output the modulation profile signal to the frequency modulator.

The profile generator may be further configured to generate the nested-modulation profile by varying a cycle and a change range of a triangle modulation profile having a triangle waveform pattern having a pre-designated cycle and a pre-designated amplitude with reference to the center frequency in a time-frequency domain.

The nested-modulation profile may have a cycle and a change range which are variable in inverse proportion to each other such that an area of a triangle, which is defined by the cycle and the change range that are variable with reference to the center frequency in the time-frequency domain, is constant.

The nested-modulation profile may have a cycle and a change range which are sequentially increased or reduced in a pre-designated pattern.

The nested-modulation profile may have a pattern in which a cycle and a change range are randomly variable.

The frequency modulator may include a fractional-N Phase-Locked Loop (PLL) configured to divide the output clock signal according to a division ratio designated by the modulation profile signal, and vary and output the frequency of the output clock signal according to a phase difference between the divided output clock signal and the input clock signal.

The frequency modulator may include: a divider configured to divide the output clock signal according to a division ratio designated by the modulation profile signal, and output a divided clock signal; a phase frequency detector configured to receive the input clock signal and the divided clock signal, and output a phase difference signal representing a phase difference between the input clock signal and the divided clock signal; a charge pump configured to generate and output a current signal corresponding to the phase difference signal; a loop filter configured to generate a voltage control signal corresponding to the current signal; and a voltage-controlled oscillator configured to adjust and output the frequency of the output clock signal according to the voltage control signal.

The profile generator may include: a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile; a register configured to pre-store the center frequency set value, an initial target set value, and an initial increasing/decreasing rate set value; a second modulator configured to generate a step index according to a pre-designated scheme in response to the flag signal, and calculate the target set value and the increasing/decreasing rate set value by using the step index, the initial target set value, and the initial increasing/decreasing rate set value; and a sigma-delta modulator configured to generate the modulation profile signal for controlling the frequency of the output clock signal according to the nested-modulation profile.

The first modulator may be configured to: receive, from the frequency modulator, a divided clock signal obtained by dividing the output clock signal according to a division ratio designated by the modulation profile signal; and in response to the divided clock signal, sequentially increase/reduce the nested-modulation profile according to a frequency interval designated by the increasing/decreasing rate set value in a range of a maximum frequency and a minimum frequency designated by the target set value from the center frequency in the time-frequency domain.

The second modulator may include: a step index generator configured to generate the step index in response to the flag signal; a nested-modulation rate calculator configured to calculate a nested-modulation rate by using the step index and an initial second modulation value pre-stored in the register, and calculate a nested slope from the nested-modulation rate; a first multiplier configured to calculate the target set value by using the nested-modulation rate and the initial target set value; and a second multiplier configured to calculate the increasing/decreasing rate set value by using the nested slope and the initial increasing/decreasing rate set value.

The step index generator may include at least one of: an up/down counter configured to, when the flag signal is received, sequentially increase/reduce and output the step index in a range within the pre-designated maximum number of steps; and a Pseudo-Random Binary Sequence (PRBS) generator configured to, when the flag signal is received, randomly select and output the step index in the range within the maximum number of the steps.

The second modulator may further include a step index selector configured to: when the step index generator includes both the up/down counter and the Pseudo-Random Binary Sequence generator, select one of respective step indices, which are output from the up/down counter and the Pseudo-Random Binary Sequence generator, according to a selection signal stored in the register; and output the selected step index to the nested-modulation rate calculator.

The up/down counter may configured to, when the flag signal is received, receive a step interval from the register, and uniformly or differentially increase/reduce the step index according to the step interval.

In accordance with another aspect of the present disclosure, there may be provided a method for generating a spread spectrum clock by a spread spectrum clock generation apparatus, the method including: generating a nested-modulation profile having a pattern in which, in a time-frequency domain, a cycle and a change range of a triangle modulation profile having a triangle waveform pattern with reference to a predetermined center frequency are variable; and generating an output clock signal, a frequency of which is variable with reference to the center frequency, by frequency-modulating an input clock signal according to the nested-modulation profile.

The nested-modulation profile may have a cycle and a change range which are variable in inverse proportion to each other such that an area of a triangle, which is defined by the cycle and the change range that are variable with reference to the center frequency in the time-frequency domain, is constant.

In accordance with still another aspect of the present disclosure, there may be provided a display device including: a display panel in which multiple sub-pixels defined by multiple data lines and multiple gate lines are arranged; a data driver configured to drive the multiple data lines; a gate driver configured to drive the multiple gate lines; a spread spectrum clock generator configured to generate a nested-modulation profile having a pattern in which, in a time-frequency domain, a cycle and a change range of a triangle modulation profile having a triangle waveform pattern with reference to a predetermined center frequency are variable, and generate an output clock signal, a frequency of which is variable with reference to the center frequency, by frequency-modulating an input clock signal according to the nested-modulation profile; and a controller configured to receive the output clock signal, and control the data driver and the gate driver according to the output clock signal.

The nested-modulation profile may have a cycle and a change range which are variable in inverse proportion to each other such that an area of a triangle, which is defined by the cycle and the change range that are variable with reference to the center frequency in the time-frequency domain, is constant.

The controller may comprise the spread spectrum clock generator.

In accordance with yet another aspect of the present disclosure, there may be provided a touch display device including: a touch panel having multiple touch electrodes arranged therein; and a touch circuit configured to output a pulse-type touch driving signal to the touch panel according to a touch synchronization signal which defines a touch interval for touch sensing, and sense whether there is a touch or a position of the touch.

The touch circuit may include: a spread spectrum clock generator configured to generate a nested-modulation profile having a pattern in which, in a time-frequency domain, a cycle and a change range of a triangle modulation profile having a triangle waveform pattern with reference to a predetermined center frequency are variable, and generate an output clock signal, a frequency of which is variable with reference to the center frequency, by frequency-modulating an input clock signal according to the nested-modulation profile; a touch driver configured to drive one or more touch electrodes among the multiple touch electrodes by supplying the one or more touch electrodes thereamong with the touch driving signal during the touch interval on the basis of the output clock signal, and acquire sensing data by signal-processing touch sensing signals sensed from the driven touch electrodes; a touch controller configured to generate a touch driving generation signal for generating the touch driving signal on the basis of the output clock signal, and receive the sensing data so as to sense whether there is a touch or a position of the touch; and a touch driving signal generator configured to generate the touch driving signal according to the touch driving generation signal, and output the touch driving signal to the touch driver.

The nested-modulation profile may have a cycle and a change range which are variable in inverse proportion to each other such that an area of a triangle, which is defined by the cycle and the change range that are variable with reference to the center frequency in the time-frequency domain, is constant.

The touch controller may comprise the spread spectrum clock generator.

The above-described aspects can provide a spread spectrum clock generation apparatus and a spread spectrum clock generation method, and a display device and a touch display device using the same which can reduce EMI.

The above-described aspects can provide a spread spectrum clock generation apparatus and a spread spectrum clock generation method, and a display device and a touch display device using the same which during transmission of data, can reduce EMI without increasing the capacity of a buffer memory of a data reception-side.

The above-described aspects can provide a spread spectrum clock generation apparatus and a spread spectrum clock generation method, and a display device and a touch display device using the same which during transmission of data, can reduce EMI without increasing jitter.

BRIEF DESCRIPTION OF THE DRAWINGS

The above and other aspects, features, and advantages of the present disclosure will be more apparent from the following detailed description taken in conjunction with the accompanying drawings, in which:

FIGS. 8A to 8C are graphs illustrating the simulation results of power spectrums of a clock signal modulated using the simulated modulation profiles of FIGS. 7A to 7C;

DETAILED DESCRIPTION

Figure 1:
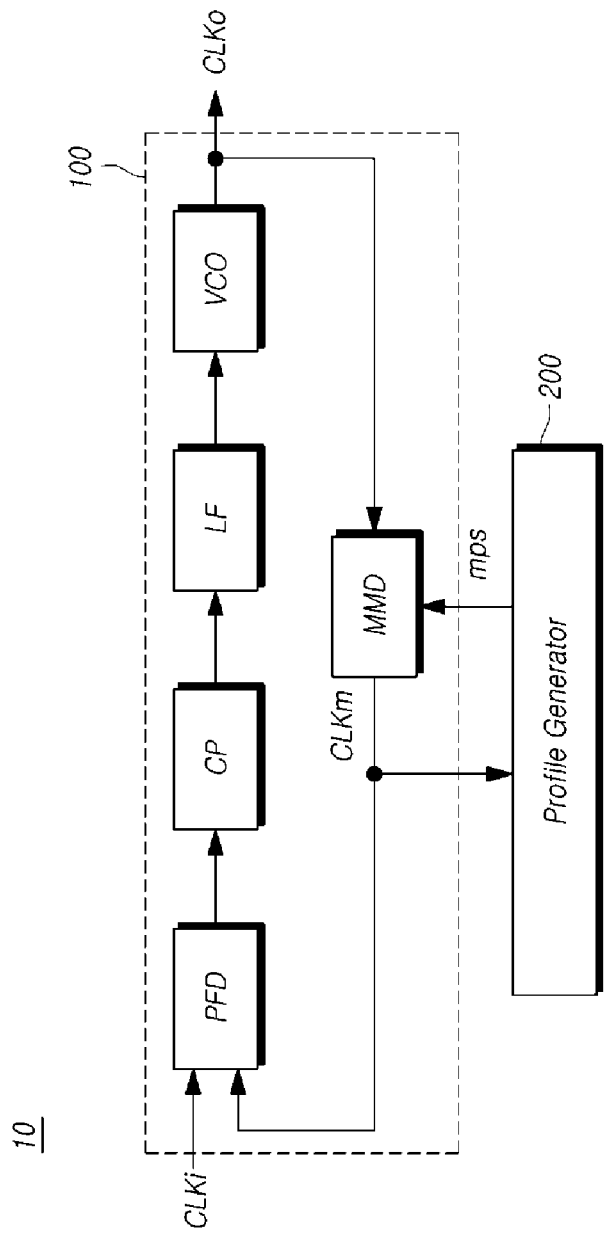
FIG. 1 is a block diagram illustrating a schematic configuration of a spread spectrum clock generation apparatus according to aspects of the present disclosure.

Hereinafter, exemplary aspects of the present disclosure will be described in detail with reference to the accompanying drawings. In assigning reference numerals to elements in the drawings, the same reference numerals will designate the same elements where possible although they are shown in different drawings. Also, in the following description of the present disclosure, a detailed description of known functions and configurations incorporated herein will be omitted when it may make the subject matter of the present disclosure rather unclear.

In addition, such terms as "first", "second", "A", "B", "(a)", "(b)", and the like, may be used herein when describing elements of the present disclosure. These terms are merely used to distinguish one element from other elements, and the essence of a corresponding element, an order thereof, a sequence thereof, or the number of the corresponding elements are not limited by the terms. When an element is described as being "connected", "coupled", or "linked" to another element, it will be understood that the element may not only be directly connected or coupled to said another element, but may also be "connected", "coupled", or "linked" to said another element through a third element, or the third element may also be interposed between the element and said another element.

FIG. 1 is a block diagram illustrating a schematic configuration of a spread spectrum clock generation apparatus according to aspects of the present disclosure.

As an example, FIG. 1 illustrates the spread spectrum clock generation apparatus 10 that modulates a clock signal in such a manner that the frequency of the clock signal has a triangle modulation waveform.

Referring to FIG. 1, the spread spectrum clock generation apparatus 10 includes a frequency modulator 100 and a profile generator 200.

The frequency modulator 100 receives an input clock signal CLKi, frequency-modulates the received input clock signal CLKi by using a modulation profile signal mps applied by the profile generator 200, and outputs an output clock signal CLKo having a variable frequency.

The profile generator 200 generates a nested-modulation profile, having a variable frequency and a variable amplitude, by varying the frequency and amplitude of a triangle modulation profile having a triangle waveform pattern with reference to a predetermined center frequency $f_{cen}$ a time-frequency in domain, generates a modulation profile by using the generated nested-modulation profile, and outputs the same to the frequency modulator 100.

The frequency modulator 100 may be implemented by a phase-locked loop PLL including a phase frequency detector PFD, a charge pump CP, a loop filter LF, a voltage-controlled oscillator VCO, and a divider MMD.

The phase frequency detector PFD receives an input clock signal CLKi and a divided clock signal CLKm, which the divider MMD outputs by dividing the frequency of an output clock signal CLKo, and outputs a phase difference signal representing the phase difference between the former and the latter.

In the present example, a phase difference signal may be output as a signal having a voltage level corresponding to the phase difference between an input clock signal CLKi and a divided clock signal CLKm.

Also, the phase frequency detector PFD may output, in such a manner as to distinguish between an up-signal and a down-signal, a phase difference signal according to whether the phase of an input clock signal CLKi precedes or lags behind that of a divided clock signal CLKm.

The charge pump CP receives a phase difference signal, generates a current signal corresponding to the received phase difference signal, and outputs the same to the loop filter LF. That is, the charge pump CP outputs, to the loop filter LF, a current signal corresponding to the phase difference between the input clock signal CLKi and the divided clock signal CLKm.

The loop filter LF may include multiple capacitors, and outputs a voltage control signal, applied to the voltage-controlled oscillator VCO, on the basis of the amount of charges charged/discharged by the multiple capacitors in response to the current signal output from the charge pump CP.

When a phase difference signal is output as a signal having a voltage level corresponding to the phase difference between the input clock signal CLKi and the divided clock signal CLKm, the frequency modulator 100 may be configured such that the phase difference signal is directly provided to the charge pump CP.

Also, the loop filter LF may serve as a low-pass filter and may filter off noise included in a voltage control signal.

The voltage-controlled oscillator VCO outputs an output clock signal CLKo having a frequency corresponding to a voltage level of the voltage control signal. In the present example, the voltage-controlled oscillator VCO outputs an output clock signal CLKo having a frequency which is variable according to a variation of a voltage level of the voltage control signal.

The divider MMD divides an output clock signal CLKo received from the voltage-controlled oscillator VCO and outputs a divided clock signal CLKm.

In the present example, the divider MMD may control the frequency of a divided clock signal CLKm by varying a frequency division ratio by using a modulation profile signal mps received from the profile generator 200.

As an example, the divider MMD may be implemented by a multi-modulus divider having variously variable frequency division ratios. The multi-modulus divider (or may also be referred to as a "fractional-N divider") may not only cover multiple frequency bands but may also adjust a frequency in a slight frequency step, and thus is often used in a frequency synthesizer or a clock generator, and the like.

The frequency modulator 100 using such a multi-modulus divider may also be referred to as a "fractional-N PLL".

That is, the frequency modulator 100 may be implemented by a fractional-N PLL configured to: divide an output clock signal CLKo by using a division ratio designated by a modulation profile signal mps; and vary and output a frequency of the output clock signal CLKo according to a phase difference between a divided clock signal CLKm and an input clock signal CLKi.

The profile generator 200 receives a divided clock signal CLKm and generates a modulation profile signal mps by using the divided clock signal CLKm. In the present example, a modulation profile signal mps is a signal for adjusting a frequency of an output clock signal CLKo and spreading a frequency spectrum of the output clock signal CLKo, that is, a signal for adjusting a division ratio of the divider MMD.

In an existing spread spectrum clock generation apparatus, as modulation profiles for modulating the frequency of a clock signal, a profile generator typically generates and outputs a sine wave modulation profile, a triangle modulation profile, and a Hershey-Kiss modulation profile.

However, in aspects of the present disclosure, the profile generator 200 may generate a nested-modulation profile NMP obtained by modulating, in an overlapping manner, the waveform of a triangle modulation profile for modulating an input clock signal CLKi once.

Figure 2:
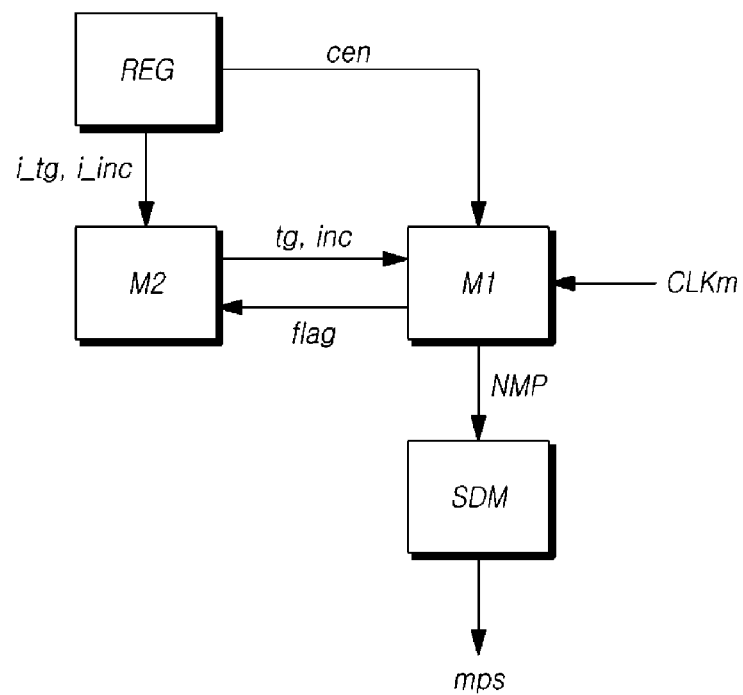
FIG. 2 is a block diagram illustrating a schematic configuration of the profile generator of FIG. 1.

FIG. 2 is a block diagram illustrating a schematic configuration of the profile generator of FIG. 1.

Referring to FIG. 2, the profile generator 200 includes a register REG, a first modulator M1, and a second modulator M2.

The register REG may store set values set_v for driving the profile generator 200.

In the present example, the set values set_v may include a center frequency set value cen for a center frequency $f_{cen}$ of an output clock signal CLKo having a variable frequency. That is, a frequency of an output clock signal CLKo may increase or decrease with reference to the center frequency $f_{cen}$.

Also, the set values set_v may include a target set value tg representing a variable frequency range of an output clock signal CLKo.

Since a frequency of an output clock signal CLKo increases or decreases with reference to the center frequency $f_{cen}$, a target set value tg is a value for setting an adjustable frequency range of the output clock signal CLKo with reference to the center frequency $f_{cen}$, and may be regarded as a frequency change width of the output clock signal CLKo with reference to the center frequency $f_{cen}$, that is, the amplitude of a nested-modulation profile NMP in a time-frequency domain.

Typically, for the stability of a system using a generated output clock signal CLKo, the spread spectrum clock generation apparatus 10 sets an adjustable frequency range so as to form a symmetrical waveform of the output clock signal CLKo with reference to a center frequency $f_{cen}$. That is, the frequency difference between the center frequency $f_{cen}$ and the maximum frequency in the frequency range is set to be identical to the frequency difference between the center frequency $f_{cen}$ and the minimum frequency therein. In the present example, the maximum or minimum frequency appears as the peak of a modulation profile.

Accordingly, a target set value tg may be set as an absolute value representing the frequency difference between the maximum or minimum frequency and the center frequency $f_{cen}$.

In this regard, in aspects of the present disclosure, a nested-modulation profile may have a maximum or minimum frequency which is variable by a nested modulation. That is, a target set value tg is variable. However, the register REG may store only an initial target set value i_tg without storing all variable target set value tg.

By this configuration, a variable target set value tg may be adjusted by the second modulator M2.

When a frequency of an output clock signal CLKo is variable, the set values set_v may include an increasing/decreasing rate set value inc which represents a variable frequency interval.

The profile generator 200 may vary a frequency according to a divided clock signal CLKm, and thus, an increasing/decreasing rate set value inc is a set value for setting a slope of a nested-modulation profile. That is, a nested-modulation profile may have not only a maximum or minimum frequency but also a slope which are variable.

Particularly, in aspects of the present disclosure, a target set value tg and an increasing/decreasing rate set value inc may be varied such that the former is inversely proportional to the latter. For example, when the target set value tg increases, the increasing/decreasing rate set value inc may decrease.

The register REG may store only an initial increasing/decreasing rate set value i_inc, and an increasing/decreasing rate set value inc which is variable afterwards may be adjusted by the second modulator M2.

The first modulator M1 receives a divided clock signal CLKm. Also, the first modulator M1 receives a center frequency set value cen from the register REG, and receives a target set value tg and an increasing/decreasing rate set value inc from the second modulator M2.

When a divided clock signal CLKm is received, the first modulator M1 gradually increases (or decreases) a frequency, designated by a modulation profile, from a center frequency $f_{cen}$ according to an increasing/decreasing rate set value inc, wherein the center frequency $f_{cen}$ is set by a center frequency set value cen. When the increased (or decreased) frequency reaches the target set value tg, the first modulator M1 gradually decreases (or increases) the frequency according to the increasing/decreasing rate set value inc.

That is, the first modulator M1 generates a modulation profile increased or decreased at frequency intervals, designated by the increasing/decreasing rate set value inc, within the frequency change range from the center frequency $f_{cen}$, wherein the frequency change range is designated by the target set value tg.

Figure 3:
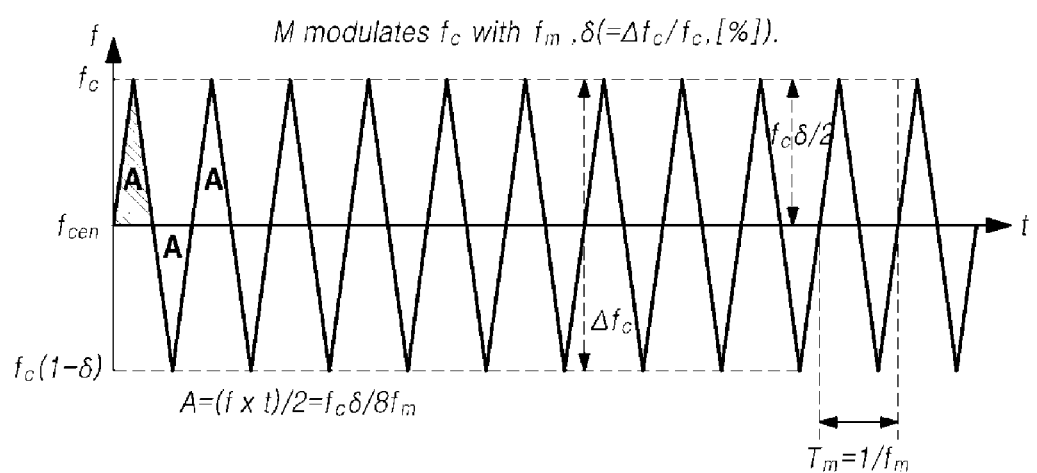
FIGS. 3 to 5 are graphs illustrating modulation profiles of a spread spectrum clock generation apparatus according to aspects of the present disclosure.

In the present example, when the second modulator M2 outputs the target set value tg and the increasing/decreasing rate set value inc which are not variable but fixed, the first modulator M1 may generate a triangle modulation profile illustrated in FIG. 3.

As an example, the first modulator M1 may be implemented by an up/down counter configured to designate a target set value tg and an increasing/decreasing rate set value inc as parameters and be driven in response to a divided clock signal CLKm.

When the first modulator M1 is implemented by an up/down counter, the center frequency $f_{cen}$ may be an initial value of the up/down counter, and the increasing/decreasing rate set value inc may be a change value of a counting value increased or decreased whenever a divided clock signal CLKm is received. Also, the target set value tg may signify a maximum or minimum value that the up/down counter can count.

In the present example, whenever a divided clock signal CLKm is received, the up/down counter increases or decreases a counting value by a change value designated by the increasing/decreasing rate set value inc, and when the counting value reaches the maximum or minimum value designated by the target set value tg, changes a sign of the change value and decreases or increases the counting value by the change value having the changed sign.

As an example, when a counting value is increased according to the divided clock signal CLKm and reaches the maximum value, the up/down counter changes a sign of a change value, and thus may gradually decrease the counting value when a divided clock signal CLKm is received afterwards.

Also, when a modulation profile having a frequency increased or decreased from the center frequency $f_{cen}$ reaches a maximum or minimum value and then reaches the center frequency $f_{cen}$ again, the first modulator M1 outputs a flag signal flag to the second modulator M2.

That is, the first modulator M1 outputs a flag signal flag at every cycle of a variable nested-modulation profile NMP.

The second modulator M2 receives an initial target set value i_tg and an initial increasing/decreasing rate set value i_inc from the register REG, and receives a flag signal flag from the first modulator M1.

When the second modulator M2 is initially driven, the second modulator M2 may determine a target set value tg and an increasing/decreasing rate set value inc on the basis of the initial target set value i_tg and the initial increasing/decreasing rate set value i_inc, and may output the determined target set value tg and the determined increasing/decreasing rate set value inc to the first modulator M1.

Then, when a flag signal flag is received from the first modulator M1, the second modulator M2 re-calculates the target set value tg and the increasing/decreasing rate set value inc according to a pre-designated scheme, and outputs the re-calculated target set value tg and the re-calculated increasing/decreasing rate set value inc to the first modulator M1. That is, the second modulator M2 may vary a target set value tg and an increasing/decreasing rate set value inc at every cycle of the nested-modulation profile NMP.

In the present example, the second modulator M2 may regularly or randomly vary the target set value tg and the increasing/decreasing rate set value inc.

As described above, when a target set value tg and an increasing/decreasing rate set value inc have fixed values, the first modulator M1 may generate and output a modulation profile having a form identical to that of a triangle modulation profile.

However, in aspects of the present disclosure, the second modulator M2 varies a target set value tg and an increasing/decreasing rate set value inc, and thus, the triangle modulation profile may be re-modulated. That is, the first modulator M1 may generate a nested-modulation profile NMP for additionally performing secondary modulation, from the waveform of a triangle modulation profile for performing primary modulation on an input clock signal CLKi.

In the present example, the profile generator 200 may further include a sigma-delta modulator SDM.

The sigma-delta modulator SDM receives a nested-modulation profile NMP from the first modulator M1, and generates a modulation profile signal mps for adjusting a division ratio of the divider MMD by using the received nested-modulation profile NMP.

In the present example, the sigma-delta modulator SDM may dither a modulation profile signal mps.

In order to reduce EMI which may occur due to an output clock signal CLKo, the profile generator 200 generates a nested-modulation profile NMP and varies the frequency of an output clock signal CLKo. However, when the nested-modulation profile NMP is regularly repeated in a particular pattern, noise due to the conditions may be generated.

In aspects of the present disclosure, when a change pattern of a nested-modulation profile NMP adjusted by the second modulator M2 is regularly repeated, noise may be generated. Particularly, a change pattern of a nested-modulation profile NMP adjusted by the second modulator M2 may be included in an audible frequency band (20 Hz to 20 kHz).

In the present example, the spread spectrum clock generation apparatus 10 may cause noise.

Accordingly, the sigma-delta modulator SDM may generate a modulation profile signal mps in such a manner that a division ratio of the divider MMD determined based on a nested modulation profile NMP is unregularly adjusted, so that it is possible to suppress the occurrence of noises from the spread spectrum clock generation apparatus 10.

Figure 4:
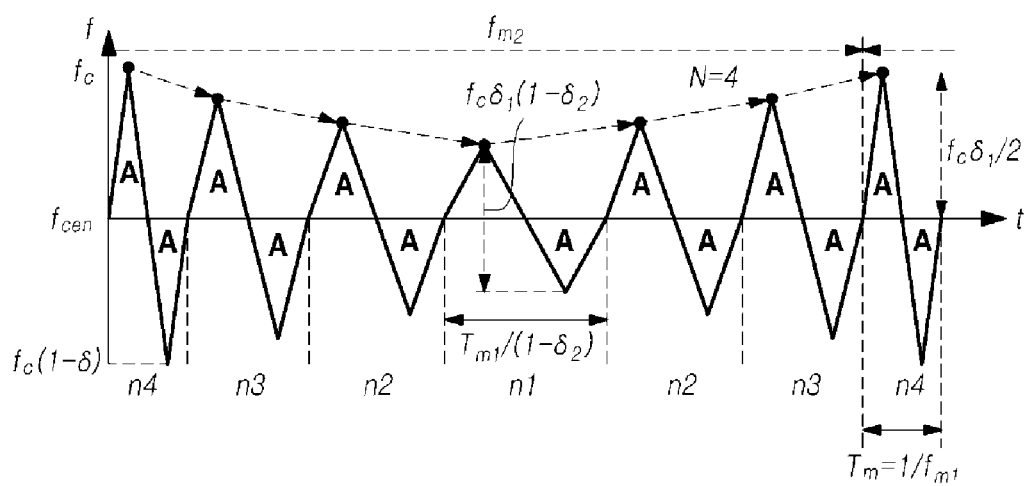
Figure 5:
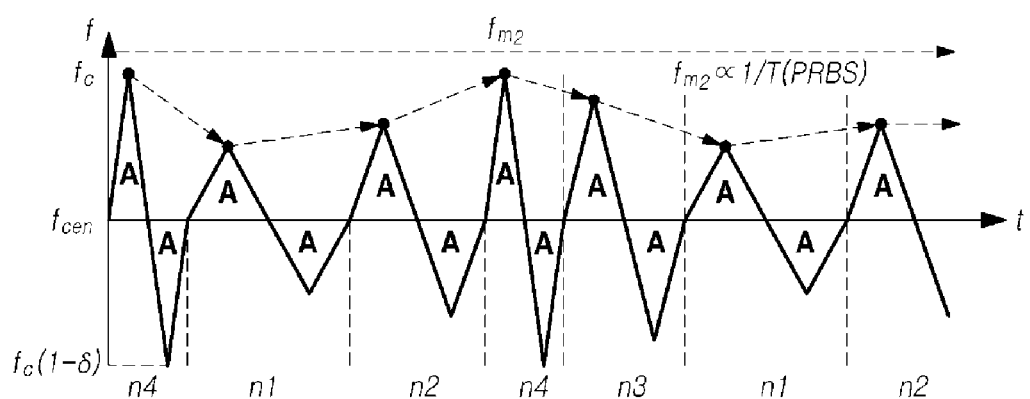

FIGS. 3 to 5 are graphs illustrating modulation profiles of a spread spectrum clock generation apparatus according to aspects of the present disclosure.

FIG. 3 illustrates an example of a modulation profile generated when the second modulator M2 fixes a target set value tg and an increasing/decreasing rate set value inc and outputs the fixed target set value tg and the fixed increasing/decreasing rate set value inc to the first modulator M1.

As illustrated in FIG. 3, when the second modulator M2 does not vary a target set value tg and an increasing/decreasing rate set value inc, a modulation profile has a simple waveform of a triangle modulation profile. Also, since the target set value tg and the increasing/decreasing rate set value inc have fixed values, FIG. 3 may be regarded as a single modulation profile generated by the first modulator M1.

The triangle modulation profile illustrated in FIG. 3 illustrates a modulation profile for downward frequency spread which causes a frequency, modulated using the modulation profile from a carrier frequency $f_c$, to become lower than the carrier frequency $f_c$. In the present example, the carrier frequency $f_c$ is a basic frequency of a pre-designated output clock signal CLKo.

Accordingly, the maximum frequency designated by the modulation profile may become the carrier frequency $f_c$.

The purpose of use of the modulation profile for downward frequency spread is to enable a reception side, which is to receive a clock signal, to stably receive an output clock signal CLKo even when the frequency of the output clock signal CLKo is variable.

In FIG. 3, the amplitude of the triangle modulation profile is a maximum spread frequency $\Delta f_c$ from the carrier frequency $f_c$.

When the ratio of the maximum spread frequency $\Delta f_c$ to the carrier frequency $f_c$ represents a modulation ratio $\delta$, the modulation ratio $\delta$ may be defined by $\delta\% = \Delta f_c / f_c$.

Also, the frequency difference between the maximum frequency and the minimum frequency, which are designated by the modulation profile from the center frequency $f_{cen}$, is one-half of the maximum spread frequency $\Delta f_c$.

Accordingly, the frequency difference between the maximum frequency and the minimum frequency from the center frequency $f_{cen}$ is calculated by $\Delta f_c 2 = f_c \times \delta / 2$. A modulation cycle $T_m$ which is a cycle of the triangle modulation profile that repeats a periodic increase/decrease is $1/f_m$ representing a reciprocal number of a modulation frequency $f_m$.

Typically, in order to reduce EMI, it is required to increase a distribution range of frequencies and reduce a frequency interval of a power spectrum. That is, it is required to increase the modulation ratio $\delta$ and reduce the modulation frequency $f_m$ (increase the modulation cycle $T_m$).

This configuration signifies that EMI becomes smaller as there is an increasing area A of a triangle which is defined by the modulation ratio $\delta$ and the modulation cycle $T_m$, that is, the change range and the cycle, with reference to the center frequency $f_{cen}$ in the triangle modulation profile depicted in a time (t)-frequency (f) domain in FIG. 3.

The area A of the triangle may be defined by $A = (f \times t)/2 = f_c \times \delta / 8 f_m$.

However, an increase in the modulation ratio $\delta$ may cause a larger jitter, and an increase in the modulation cycle $T_m$ becomes a main cause which increases the cumulative amount of the caused jitter. That is, the area A of the triangle is proportional to the amount of cumulative jitter.

Accordingly, the reception side which receives a clock signal is required to include a larger capacity of an input buffer memory. In the present example, the input buffer memory may be a First Input First Output (FIFO) memory. That is, when the area A of the triangle is increased in order to reduce EMI, it is required to increase the capacity of a FIFO memory.

In addition, in most cases, a bandwidth of a data transmission channel established with reference to a carrier frequency $f_c$ is predetermined, and thus, it is impossible to optionally increase a modulation ratio $\delta$.

As a result, it is not easy to increase the area A of the triangle in order to additionally reduce EMI.

FIGS. 4 and 5 illustrate modulation profiles which are examples of nested-modulation profiles NMP obtained by re-modulating the triangle modulation profile illustrated in FIG. 3.

FIG. 4 illustrates an example of a modulation profile generated when the second modulator M2 outputs a target set value tg and an increasing/decreasing rate set value inc to the first modulator M1 while regularly varying the same in a pre-designated pattern.

FIG. 4 illustrates a nested-modulation profile obtained when a modulation ratio $\delta$ and a modulation cycle $T_m$ of a triangle modulation profile are regularly varied while a target set value tg and an increasing/decreasing rate set value inc are adjusted in a pre-designated pattern.

In the present example, whenever a flag signal flag is received from the first modulator M1, the second modulator M2 may adjust a change range of the nested-modulation profile by varying a target set value tg such that the same gradually increases or decreases.

A change in a waveform of the nested-modulation profile according to such an increase or decrease in the target set value tg may be regarded as a kind of Amplitude Modulation (AM) scheme.

However, the configuration according to the present disclosure differs from the AM scheme in that the second modulator M2 does not vary only the target set value tg but varies the increasing/decreasing rate set value inc together with the target set value tg. That is, the second modulator M2 varies, together, a change range and a slope of the nested-modulation profile NMP, and at this time, may vary the target set value tg and the increasing/decreasing rate set value inc in such a manner that a change in the target set value tg is inversely proportional to a change in the increasing/decreasing rate set value inc.

Accordingly, a cycle of the waveform of the nested-modulation profile NMP are reduced or increased in inverse proportion to a change in an amplitude thereof.

By this configuration, in the nested-modulation profile NMP, the area A of a triangle defined by a modulation ratio δ and a modulation cycle $T_m$ with reference to the center frequency $f_{cen}$ may be constantly maintained even when the target set value tg and the increasing/decreasing rate set value inc are varied.

In FIG. 4, the maximum number of steps by which the target set value tg can be varied by the second modulator M2 is represented by N (e.g., 4 in FIG. 4), and n represents a step index which is periodically varied from N representing the maximum number of steps to 1 and again to N. In the present example, the step index n may be regarded as a nested-modulated value which is set by the second modulator M2.

Also, a periodically-changed step index n may be varied in a uniform manner, such as (4, 3, 2, 1, 2, 3, 4), as illustrated in FIG. 4 within the maximum number N of steps, but may be differentially changed.

As an example, when the maximum number N of steps is 8, the step index n may be varied in a differential manner such as (8, 4, 2, 1, 2, 4, 8). A change interval of the step index n, that is, a step interval stp, may also be pre-stored in the register REG and may be transmitted to the second modulator M2.

Also, $cδ_1(n)$ and $cf_{m1}(n)$ represent a variable first modulation ratio and a variable first modulation frequency, respectively, which are changed by a target set value tg varied according to each step index n.

Further, $δ_1$ represents the maximum value of the variable first modulation ratio, and $f_{m1}$ represents the maximum value of the variable first modulation frequency. Accordingly, a maximum of the variable first modulation ratio $δ_1$ is calculated by $δ_1=\max (cδ_1(n))$, and a maximum of the variable first modulation frequency $f_{m1}$ is calculated by $f_{m1}=\max (cf_{m1}(n))$.

In the present example, the variable first modulation ratio $cδ_1(n)$ and the variable first modulation frequency $cf_{m1}(n)$ may be calculated by $cδ_1(n)=δ_1×(n/N)$ and $cf_{m1}(n)=f_{m1}×(n/N)$, respectively.

Accordingly, according to the variation of the step index n, the variable first modulation ratio $cδ_1(n)$ increases or decreases, and the variable first modulation frequency $cf_{m1}(n)$ increases or decreases such that the quotient of the variable first modulation ratio $cδ_1(n)$ divided by the variable first modulation frequency $cf_{m1}(n)$ is uniformly maintained.

Therefore, the area A of a triangle may be identically maintained even when the step index n is varied. In FIG. 4, the area A of a triangle may be identical to the area A of a triangle illustrated in FIG. 3, and may be calculated by $A=f_c×δ/8f_m=½×(f_c×δ_1×(1-δ_2)/2)×(T_{m1}/2(1-δ_2))=(f_c×δ_1)T_{m1}/8=f_c×cδ_1(n)/8cf_{m1}(n)$.

A second modulation ratio $δ_2$ generated by the second modulator M2 may be determined based on a variation of the variable first modulation ratio $cδ_1$, and may be defined as $(N-1)/N$.

A second modulation frequency $f_{m2}$ generated by the second modulator M2 is defined as the frequency of changes in the variable first modulation frequency $cf_{m1}$, and is proportional to 1/N.

As a result, a power spectrum changed by a variation expressed by the variable first modulation ratio $cδ_1(n)$ is compensated by the variable first modulation frequency $cf_{m1}(n)$.

Also, since the second modulator M2 changes the regularity of a frequency distribution of the single modulation profile illustrated in FIG. 3 by using the variable first modulation ratio $cδ_1(n)$ and the variable first modulation frequency $cf_{m1}(n)$, various combinations of frequency distributions are generated in the nested-modulation profile.

Due to this configuration, the second modulation frequency $f_{m2}$, which represents a frequency interval of a power spectrum of an output clock signal CLKo modulated by a nested-modulation profile, becomes less than the modulation frequency $f_m$ representing a frequency interval in the case of the single modulation profile illustrated in FIG. 3.

When FIG. 3 is compared with FIG. 4, the second modulation frequency $f_{m2}$ is much less than the modulation frequency $f_m$ ($f_{m2}<<f_m$).

Accordingly, a power spectrum of an output clock signal CLKo, the frequency of which is varied using the nested-modulation profile, can spread in a smaller area having a smaller amplitude than in the case of an output clock signal CLKo according to the single modulation profile.

The area A of a triangle is maintained so as to be identical to the area A of a triangle illustrated in FIG. 3, and thus, it is also unnecessary to increase the capacity of an input buffer memory of the reception side. However, the nested-modulation profile makes it possible to additionally modulate a regularly-modulated single modulation profile and generate various combinations of frequency distributions, so that EMI can be reduced.

As a result, even without increasing the capacity of an input buffer memory, EMI can be reduced.

In addition, the maximum slope of the nested-modulation profile is less than or equal to that of the triangle modulation profile, and thus, jitter at a maximum circulation cycle also appears to be less than or equal to jitter in the case of the triangle modulation profile, so that a data transfer rate is not reduced.

FIG. 5 illustrates an example of a modulation profile generated when the second modulator M2 outputs a target set value tg and an increasing/decreasing rate set value inc to the first modulator M1 while randomly varying the same.

In FIG. 5, consideration is given to a case, in which the maximum number N of steps by which the target set value tg can be varied, is 4 as in FIG. 4. Accordingly, a step index n, which is variable in a range of 1 to N, has a value of 1 to 4.

In this regard, the second modulator M2 randomly varies a target set value tg and an increasing/decreasing rate set value inc whenever a flag signal flag is received, and thus, a step index n is randomly selected.

By this configuration, a variable first modulation ratio $cδ_1(n)$ and a variable first modulation frequency $cf_{m1}(n)$ are randomly varied differently from the example of FIG. 4.

In the present example, a flag signal flag is output from the first modulator M1 at every variable first modulation cycle $T_{m1}$ which is a reciprocal number of the variable first modulation frequency $cf_{m1}(n)$, and thus, the variable first modulation ratio $cδ_1(n)$ and the variable first modulation frequency $cf_{m1}(n)$ are not varied during the variable first modulation cycle $T_{m1}$.

That is, two triangles shown with reference to a center frequency $f_{cen}$ have a symmetrical form during the variable first modulation cycle $T_{m1}$. The purpose of this configuration is to prevent jitter from being accumulated.

The second modulator M2 randomly varies the target set value tg and the increasing/decreasing rate set value inc, and thus, the nested-modulation profile of FIG. 5 can further reduce EMI as compared with the nested-modulation profile of FIG. 4.

In the present example, the area A of a triangle may also be identically maintained, making it possible to identically maintain the capacity of an input buffer memory.

Figure 6:
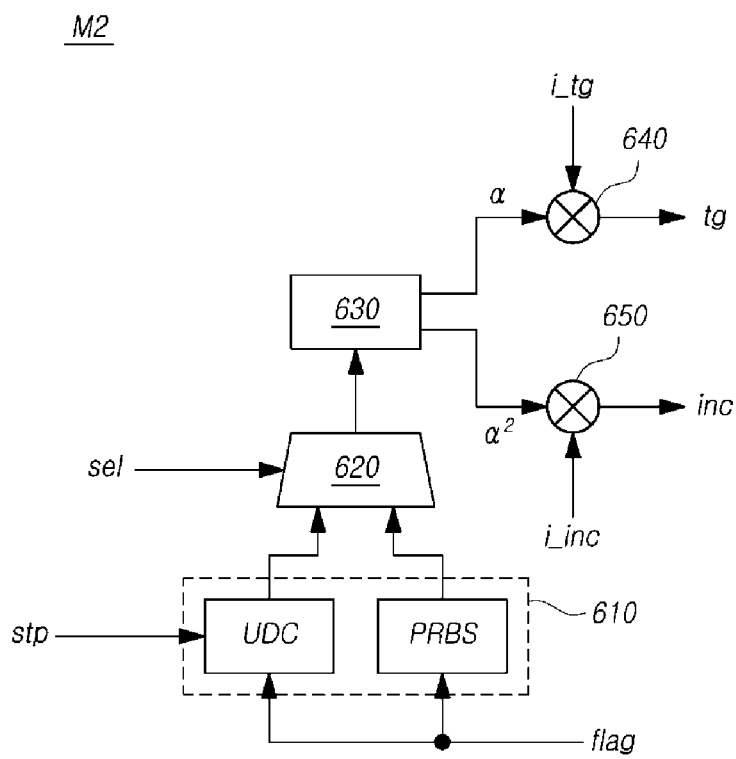
FIG. 6 is a block diagram illustrating a specific configuration of the second modulator of FIG. 2.

FIG. 6 is a block diagram illustrating a specific configuration of the second modulator of FIG. 2.

Referring to FIG. 6, the second modulator M2 includes a step index generator 610, a step index selector 620, a nested-modulation rate calculator 630, and first and second multipliers 640 and 650.

First, when a flag signal flag is received from the first modulator M1, the step index generator 610 generates and outputs a step index n.

In the present example, the step index generator 610 may generate a step index n in a pre-designated pattern and may output the same. Also, the step index generator 610 may randomly generate a step index n and may output the same.

When generating a step index n in the pre-designated pattern, the step index generator 610 may be implemented by an up/down counter UDC configured to sequentially increase or reduce a step index n in a designated range in response to a flag signal flag and output the same.

In the present example, the range in which the up/down counter UDC varies the step index n, that is, a range of the step index n, may be pre-designated by the register REG. By this configuration, when a flag signal flag is received, the up/down counter UDC sequentially increases (or reduces) the step index n by a designated increment (or decrement), and when the step index n reaches the designated range, sequentially reduces (or increases) the step index n by a designated decrement (or increment). That is, the step index n may be repeatedly increased or decreased within the maximum number N of steps.

Also, the up/down counter UDC may receive a step interval stp from the register REG and may vary a variation of the step index n sequentially increased or reduced according to the received step interval stp.

That is, as described above, the up/down counter UDC may vary the step index n in a uniform manner such as (4, 3, 2, 1, 2, 3, 4), or may vary the same in a differential manner such as (8, 4, 2, 1, 2, 4, 8).

When randomly generating a step index n, the step index generator 610 may include a pseudo-random binary sequence generator PRBS configured to randomly generate a step index n in response to a flag signal flag.

The step index generator 610 may include at least one of the up/down counter UDC and the pseudo-random binary sequence generator PRBS. However, when the step index generator 610 includes both the up/down counter UDC and the pseudo-random binary sequence generator PRBS, the second modulator M2 may include a step index selector 620 configured to select one of a step index n generated by the up/down counter UDC and a step index n generated by the pseudo-random binary sequence generator PRBS.

The step index selector 620: receives a selection signal sel from the register REG; selects, according to the received selection signal sel, one of a step index n generated by the up/down counter UDC and a step index n generated by the pseudo-random binary sequence generator PRBS; and transmits the same to the nested-modulation rate calculator 630.

When the step index generator 610 includes at least one of the up/down counter UDC and the pseudo-random binary sequence generator PRBS, the step index selector 620 may be omitted.

The nested-modulation rate calculator 630 receives a step index n from the step index selector 620, and calculates a nested-modulation rate $\alpha$ by using a pre-designated initial second modulation ratio $i\_\delta_2$ according to the received step index n.

In the present example, the initial second modulation ratio $i\_\delta_2$ signifies an initial value of a second modulation ratio $\delta_2$ of the second modulator M2, and has a fixed constant value which is not 0. The reason why the nested-modulation rate calculator 630 calculates the nested-modulation rate $\alpha$ by using the initial second modulation ratio $i\_\delta_2$ rather than the second modulation ratio $\delta_2$ is because the second modulation ratio $\delta_2$ may also be varied.

When a step index n is varied in a uniform manner such as (4, 3, 2, 1, 2, 3, 4) as illustrated in FIG. 4, the second modulation ratio $\delta_2$ may be set to a fixed value identical to the initial second modulation ratio $i\_\delta_2$.

However, when the step index n is differentially varied or is randomly varied as illustrated in FIG. 5, the second modulation ratio $\delta_2$ is also variable. Also, it is difficult to derive such a variable second modulation ratio $\delta_2$ through calculation. In this regard, in the present disclosure, use is made of a nested-modulation rate $\alpha$ calculated using the fixed initial second modulation ratio $i\_\delta_2$ and the step index n.

As an example, a nested-modulation rate $\alpha$ may be calculated by multiplying an initial second modulation ratio $i\_\delta_2$ by a step index n, that is, $\alpha = i\_\delta_2 \times n$.

In the present example, the nested-modulation rate $\alpha$ is a value for adjusting a variable target set value tg of a nested-modulation profile NMP.

When a nested-modulation rate $\alpha$ is calculated, the nested-modulation rate calculator 630 may calculate a nested slope $\alpha^2$ from the nested-modulation rate $\alpha$. When the nested-modulation rate $\alpha$ is a value for adjusting a target set value tg of the nested-modulation profile NMP, the nested slope $\alpha^2$ is a value for adjusting the slope of the nested-modulation profile NMP, and is a value for adjusting an increasing/decreasing rate set value inc.

As an example, the nested slope $\alpha^2$ may be calculated as a square number of a nested-modulation rate $\alpha$.

Among the first and second multipliers 640 and 650, the first multiplier 640 acquires a target set value tg by multiplying the nested-modulation rate $\alpha$, calculated by the nested-modulation rate calculator 630, by the initial target set value $i\_tg$ received from the register REG. Then, the first multiplier 640 outputs the acquired target set value tg to the first modulator M1.

The second multiplier 650 acquires an increasing/decreasing rate set value inc by multiplying the nested slope $\alpha^2$, calculated by the nested-modulation rate calculator 630, by the initial increasing/decreasing rate set value $i\_inc$ received from the register REG, and outputs the same to the first modulator M1.

By this configuration, when a divided clock signal CLKm is received, the first modulator M1 generates a modulation profile which is increased or reduced in a variable frequency increment/decrement unit designated by the increasing/decreasing rate set value inc in a variable frequency range designated by the target set value tg with reference to a center frequency $f_{cen}$.

Figure 7A:
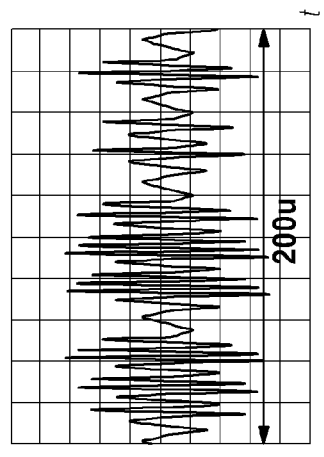
FIGS. 7A to 7C are graphs illustrating the simulation results of the modulation profiles illustrated in FIGS. 3 to 5.
Figure 7B:
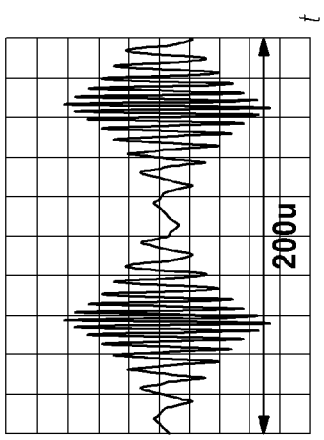
Figure 7C:
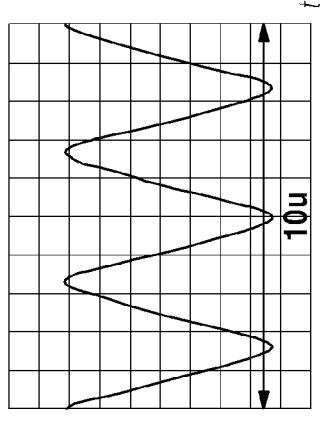

FIG. 7A to 7C are graphs illustrating the simulation results of the modulation profiles illustrated in FIGS. 3 to 5. FIGS. 8A to 8C are graphs illustrating the simulation results of power spectrums of a clock signal modulated using the simulated modulation profiles of FIG. 7.

FIG. 7A illustrates the simulation result of the modulation profile illustrated in FIG. 3, and illustrates a triangle modulation profile generated when a target set value tg and an increasing/decreasing rate set value inc are fixed.

In FIG. 7A, a modulation frequency $f_m$ is 300 kHz and a modulation ratio δ is 1.5%.

FIGS. 7A and 7B illustrate the respective nested-modulation profiles illustrated in FIG. 4 and FIG. 5, respectively, and each illustrate a case in which a first modulation ratio ($δ_1$=max ($cδ_1(n)$)) and a first modulation frequency ($f_{m1}$=max ($cf_{m1}(n)$)) are 1.5% and 300 kHz, respectively, as shown in FIG. 7A.

FIGS. 7B and 7C each illustrate a case in which the maximum number N of steps is 8. Also, in FIG. 7B, a step interval step is 1.

As compared with FIG. 8A, it can be noted that a power spectrum of FIG. 8B shows its peak reduced by 6 dB, wherein FIG. 8A corresponds to the triangle modulation profile of (a) of FIG. 7 and (b) of FIG. 8 corresponds to the sequential nested-modulation profile of FIG. 7B. As compared with FIG. 8A, it can be noted that a power spectrum of FIG. 8C shows its peak reduced by 11 dB, wherein FIG. 8C corresponds to the random nested-modulation profile of FIG. 7C. Therefore, it can be noted in FIG. 8 that EMI can be reduced.

Table 1 shows a comparison between EMI reduction amounts according to modulation profiles.

TABLE 1

|  |  | Nested | Nested with RM | Triangular | Hershey-Kiss |
|---|---|---|---|---|---|
| Area |  | 1410 | 1603 | 1197 | 3845 |
| Power (μW) |  | 127 | 145 | 114 | 219 |
| EMI Reduction (dB) (RBW = 1 kHz) | step = /2 | 30.2 | 32.9 | 26.4 | 24.8 |
|  | step = 1 | 31.4 |  |  |  |

In Table 1, Nested represents a sequential nested-modulation profile, Nested with RM represents a random nested-modulation profile, Triangular represents a triangle modulation profile, and Hershey-Kiss represents a Hershey-Kiss modulation profile.

In Table 1, step represents a step interval stp, and step=/2 represents a case in which a step index n is varied in a differential manner such as (8, 4, 2, 1, 2, 4, 8).

In Table 1, a modulation frequency $f_m$ and a first modulation frequency $f_{m1}$ are both 150 kHz, and a modulation ratio δ and a first modulation ratio $δ_1$ are both 1.5%. Also, a second modulation ratio $δ_2$ of the sequential nested-modulation profile is 87.5%; and a second modulation frequency $f_{m2}$ is set to 7.14 kHz when a step interval stp is/2, and is set to 4.35 kHz when the step interval stp is 1.

As shown in Table 1, when a resolution bandwidth (hereinafter RBW) of a spectrum analyzer is 1 kHz, it can be noted that the random nested-modulation profile shows the largest EMI reduction value, and that the sequential nested-modulation profile shows a large EMI reduction value following the largest EMI reduction value of the random nested-modulation profile.

From Table 1, in the case of a sequential nest-modulation profile, compared to the triangle modulation profile and the Hershey-Kiss modulation profile, EMI is significantly reduced.

Particularly, even when a nested-modulation profile according to the present disclosure is obtained by modulating the triangle modulation profile in an overlapping manner, the nested-modulation profile can uniformly maintain the area A of a triangle defined by a modulation ratio δ and a modulation cycle $T_m$ with reference to a center frequency $f_{cen}$, so as to prevent an increase in jitter, making it possible to maintain the size of an FIFO memory which is identical to the existing size thereof.

Figure 9:
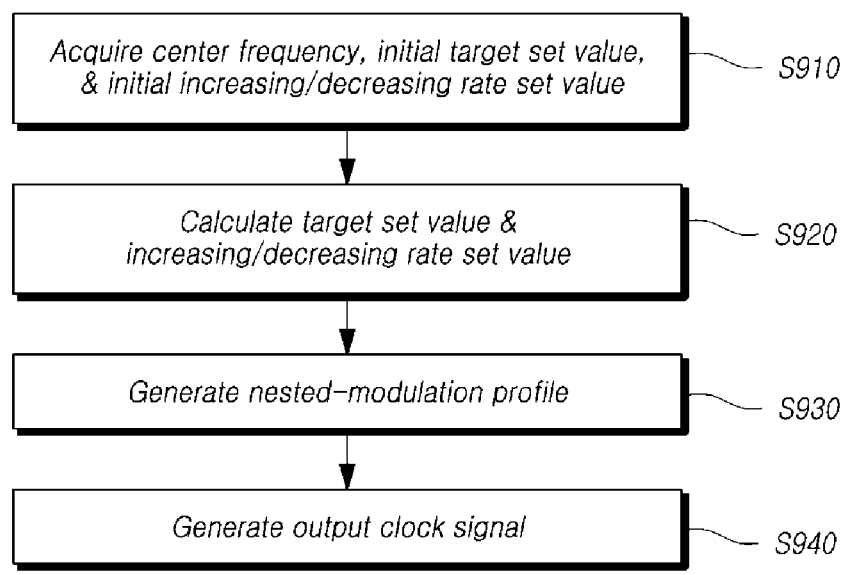
FIG. 9 is a flowchart illustrating a spread spectrum clock generation method according to aspects of the present disclosure.

FIG. 9 is a flowchart illustrating a spread spectrum clock generation method according to aspects of the present disclosure.

Referring to FIGS. 1 to 8, the spread spectrum clock generation method illustrated in FIG. 9 is described. First, in operation S910, the profile generator 200 of the spread spectrum clock generation apparatus 10 acquires a center frequency set value cen, an initial target set value i_tg, and an initial increasing/decreasing rate set value i_inc which are pre-stored in the register REG.

In the present example, the center frequency set value cen is a set value of a center frequency $f_{cen}$ of a variable output clock signal CLKo, the initial target set value i_tg is a pre-designated initial value among set values of a frequency difference between a maximum or minimum frequency, which is variable by a nested modulation, and the center frequency $f_{cen}$, and the initial increasing/decreasing rate set value i_inc is an initial value of a slope of a nested-modulation profile which is variable by a nested modulation.

Also, in operation S920, the second modulator M2 of the profile generator 200 calculates a target set value tg and an increasing/decreasing rate set value inc by using a step index n generated using a pre-designated scheme, the initial target set value i_tg, and the initial increasing/decreasing rate set value i_inc.

In the present example, in a pre-designated range, the step index n may be sequentially generated according to a designated pattern or may be randomly generated. Also, the sequentially-generated step index n may be generated while being varied according to a uniform variation, or may be generated while a variation is differentially varied.

The target set value tg may be calculated by multiplying a nested modulation rate α, which is calculated according to an initial second modulation ratio $i\_δ_2$ and the set index n, by the initial target set value i_tg.

Also, the increasing/decreasing rate set value inc may be calculated by multiplying a nested slope $α^2$, calculated as a square number of the nested modulation rate α, by the initial increasing/decreasing rate set value i_inc.

In operation S930, when the second modulator M2 calculates the target set value tg and the increasing/decreasing rate set value inc, the first modulator M1 generates a nested-modulation profile NMP by using the center frequency set value cen, the target set value tg, and the increasing/decreasing rate set value inc.

In the present example, the nested-modulation profile NMP is a profile generated by modulating a single modulation profile, which is regularly modulated in the form of a triangle modulation profile, using the center frequency set value cen, the target set value tg, and the increasing/decreasing rate set value inc.

Particularly, according to the present disclosure, even when the target set value tg, and the increasing/decreasing rate set value inc are varied, the nested-modulation profile NMP in a time-frequency domain has a triangle of which the area A is always constantly maintained ($A=f_c×cδ_1(n)/8cf_{m1}(n)$), wherein the triangle is defined by the variable first modulation ratio $cδ_1(n)$ and the variable first modulation frequency $cf_{m1}(n)$ of an output clock signal CLKo with reference to the center frequency $f_{cen}$.

When the nested-modulation profile NMP is generated, the profile generator 200 generates and outputs a modulation profile signal mps, which causes the frequency modulator

100 to vary a division ratio of the divider MMD, by using the generated nested-modulation profile NMP.

Then, in operation S940, the divider MMD: divides an output clock signal CLKo received from the voltage-controlled oscillator VCO in a frequency division ratio according to the modulation profile signal mps; outputs a divided clock signal CLKm; and causes the frequency modulator 100 to output an output clock signal CLKo corresponding to the phase difference between an input clock signal CLKi and the divided clock signal CLKm.

In the present example, when the modulation profile having a frequency increased or reduced from the center frequency $f_{cen}$ reaches the maximum value or the minimum value and then reaches the center frequency $f_{cen}$ again, that is, when the modulation profile reaches one cycle thereof, the profile generator 200 generates a flag signal flag, varies a step index n according to the generated flag signal flag, and re-calculates the target set value tg and the increasing/decreasing rate set value inc, making it possible to vary, at every one cycle, the target set value tg and the increasing/decreasing rate set value inc.

That is, the profile generator 200 may generate a nested-modulation profile NMP obtained by additionally performing secondary modulation on the waveform of a triangle modulation profile which is a single modulation profile.

An output clock signal CLKo, a frequency of which is varied according to the nested-modulation profile NMP obtained by re-modulating the triangle modulation profile, may have various combinations of frequency distributions, making it possible to reduce EMI.

Also, in the time-frequency domain, the area A of a triangle, which is defined by the variable first modulation ratio $c\delta_1(n)$ and the variable first modulation frequency $cf_{m1}(n)$ of the output clock signal CLKo with reference to the center frequency $f_{cen}$, is always constantly maintained $(A=f_c \times c\delta_1(n)/8cf_{m1}(n))$, so that jitter is not increased and the capacity of an FIFO memory does not need to be increased.

Figure 10:
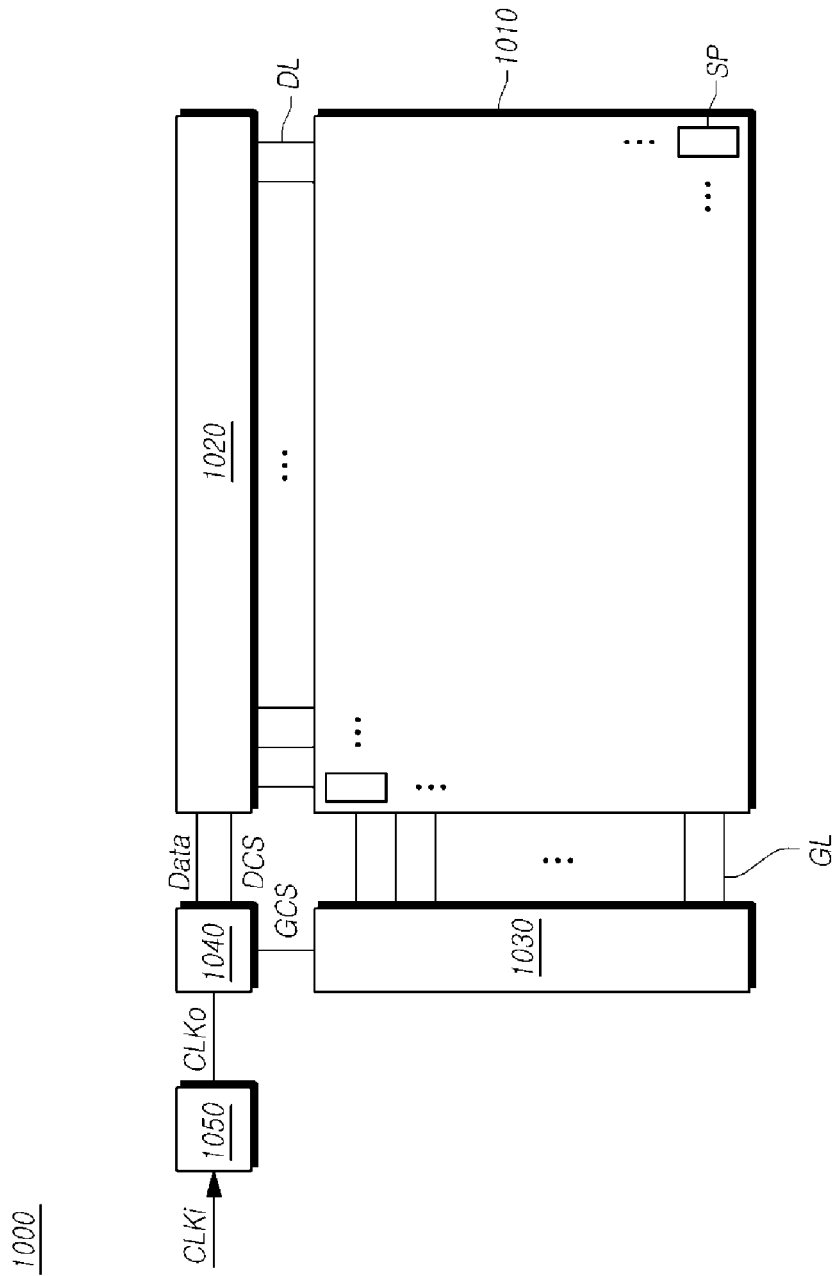
FIG. 10 is a block diagram illustrating a schematic system configuration of a display device according to aspects of the present disclosure.

FIG. 10 is a block diagram illustrating a schematic system configuration of a display device according to aspects of the present disclosure.

Referring to FIG. 10, the display device 1000 according to aspects of the present disclosure includes: a display panel 1010 in which multiple data lines DL and multiple gate lines GL are arranged and multiple sub-pixels SP defined by the multiple data lines DL and the multiple gate lines GL are arranged; a data driver 1020 configured to drive the multiple data lines DL; a gate driver 1030 configured to drive the multiple gate lines GL; a controller 1040 configured to control the data driver 1020 and the gate driver 1030; and the like.

Also, the display device 1000 according to aspects of the present disclosure includes a spread spectrum clock generator 1050.

The spread spectrum clock generator 1050 receives an input clock signal CLKi, frequency-modulates the received input clock signal CLKi, and outputs an output clock signal CLKo having a variable frequency.

In the present example, the spread spectrum clock generator 1050, which includes the first modulator M1 and the second modulator M2, may generate a nested-modulation profile NMP, may modulate an input clock signal CLKi by using the nested-modulation profile NMP, and may generate a nested-modulated output clock signal CLKo. The nested-modulation profile NMP causes a frequency of an output clock signal CLKo to be repeatedly increased or reduced by stages according to a variable target set value tg and a variable increasing/decreasing rate set value inc with reference to a predetermined center frequency $f_{cen}$. That is, this configuration makes it possible to reduce EMI.

Particularly, in aspects of the present disclosure, a nested-modulation profile NMP causes the area A of a triangle, which is defined by the variable first modulation ratio $c\delta_1(n)$ and the variable first modulation frequency $cf_{m1}(n)$ of an output clock signal CLKo with reference to a center frequency $f_{cen}$ in the time-frequency domain, to always be constant $(A=f_c \times c\delta_1(n)/8cf_{m1}(n))$, so that jitter is not increased and even when a frequency of the output clock signal CLKo is varied, it is possible to prevent an increase in the capacity of an FIFO memory, that is, a buffer memory, of the controller 1040 that receives the output clock signal CLKo.

In the present example, an input clock signal CLKi may be input together with input image data from the outside.

Also, for convenience of description, in FIG. 10, the spread spectrum clock generator 1050 is illustrated as a separate element, but the spread spectrum clock generator 1050 may be implemented to be included in the controller 1040.

The controller 1040 receives an output clock signal CLKo modulated and output by the spread spectrum clock generator 1050, and supplies various control signals to the data driver 1020 and the gate driver 1030 on the basis of the received output clock signal CLKo, so as to control the data driver 1020 and the gate driver 1030.

In the present example, the spread spectrum clock generator 1050 may also transmit the output clock signal CLKo to the data driver 1020 and the gate driver 1030 so as to enable the data driver 1020 and the gate driver 1030 to operate in synchronization with the controller 1040.

The controller 1040: starts a scan according to timing implemented in each frame; changes input image data, which is input from the outside, so as to meet a data signal format used by the data driver 1020, and outputs the changed image data Data; and controls data driver 1020 at appropriate timing according to the scan.

The controller 1040 supplies various control signals to the data driver 1020 and the gate driver 1030 on the basis of an output clock signal CLKo having a variable frequency, and thus it is also possible to suppress the occurrence of EMI from the data driver 1020 and the gate driver 1030. Also, the capacity of a buffer memory of each of the data driver 1020 and the gate driver 1030 does not need to be increased.

The controller 1040 may be a timing controller used by the conventional display technology or a control apparatus that includes the timing controller and further performs other control functions.

The controller 1040 may be implemented as a component separate from the data driver 1020, or the same, together with the data driver 1020, may be implemented as an integrated circuit.

The data driver 1020 drives the multiple data lines DL by supplying data voltages to the multiple data lines DL. In the present example, the data driver 1020 may also be referred to as a "source driver".

The data driver 1020 may include at least one source driver integrated circuit SDIC so as to drive multiple data lines.

Each source driver integrated circuit SDIC may include a shift register, a latch circuit, a digital-to-analog converter DAC, an output buffer, and the like.

As described above, each source driver integrated circuit SDIC may receive an output clock signal CLKo, and may operate based on the received output clock signal CLKo, so as to perform an operation in synchronization with the controller 1040.

The gate driver 1030 sequentially drives the multiple gate lines GL by sequentially supplying a scan signal to the multiple gate lines GL. In the present example, the gate driver 1030 may also be referred to as a "scan driver".

The gate driver 1030 may include at least one gate driver integrated circuit GDIC.

Each gate driver integrated circuit GDIC may include a shift register, a level shifter, and the like.

Also, each gate driver integrated circuit GDIC may receive an output clock signal CLKo, and may operate based on the received output clock signal CLKo, so as to perform an operation in synchronization with the controller 1040.

Under the control of the controller 1040, the gate driver 1030 sequentially supplies a scan signal of an on-voltage or an off-voltage to the multiple gate lines GL.

When particular gate lines GL are open by the gate driver 1030, the data driver 1020 converts image data received from the controller 1040 into data voltages having an analog form and supplies the same to the multiple data lines DL.

The controller 1040 may receive various timing signals, including a vertical synchronization signal Vsync, a horizontal synchronization signal Hsync, an input Data Enable (DE) signal, and the like, as well as the input image data from the outside (e.g., a host system).

Particularly, the controller 1040 may include the spread spectrum clock generator 1050 so as to receive an input clock signal CLKi.

Also, the controller 1040 generates various control signals by using the received timing signals, and outputs the same to the data driver 1020 and the gate driver 1030.

For example, in order to control the gate driver 1030, the controller 1040 outputs various gate control signals GCS, including a gate start pulse GSP, a gate shift clock GSC, a gate output enable signal GOE, and the like.

In the present example, the gate start pulse GSP controls operation start timing of one or more gate driver integrated circuits constituting the gate driver 1030. The gate shift clock GSC is a clock signal commonly input to the one or more gate driver integrated circuits, and controls shift timing of a scan signal (a gate pulse). The gate output enable signal GOE designates timing information of the one or more gate driver integrated circuits.

Also, in order to control the data driver 1020, the controller 1040 outputs various data control signals DCS, including a source start pulse SSP, a source sampling clock SSC, a source output enable signal SOE, and the like.

In the present example, the source start pulse SSP controls data sampling start timing of one or more source driver integrated circuits constituting the data driver 1020. The source sampling clock SSC is a clock signal for controlling sampling timing of data in each source driver integrated circuit. The source output enable signal SOE controls output timing of the data driver 1020.

In addition, the controller 1040 may output an output clock signal CLKo, obtained by performing nested modulation on the input clock signal CLKi, to the data driver 1020 and the gate driver 1030.

In FIG. 10, the display device 1000 may be implemented by a Liquid Crystal Display (LCD) Device, a plasma display device (a Plasma Display Panel (PDP) device), an Organic Light-Emitting Display (OLED) Device, and the like.

Also, the types and number of circuit elements constituting each sub-pixel SP may be variously determined based on functions provided by the circuit elements, a design scheme, and the like.

As a result, the display device of FIG. 10 using the spread spectrum clock generator 1050 operates based on an output clock signal CLKo of which a frequency is variable by frequency-modulating the input clock signal CLKi, so as to be capable of remarkably reducing EMI even without increasing jitter and the capacity of a buffer memory. Accordingly, it is possible to prevent the occurrence of a malfunction or fault which may occur due to EMI.

Figure 11:
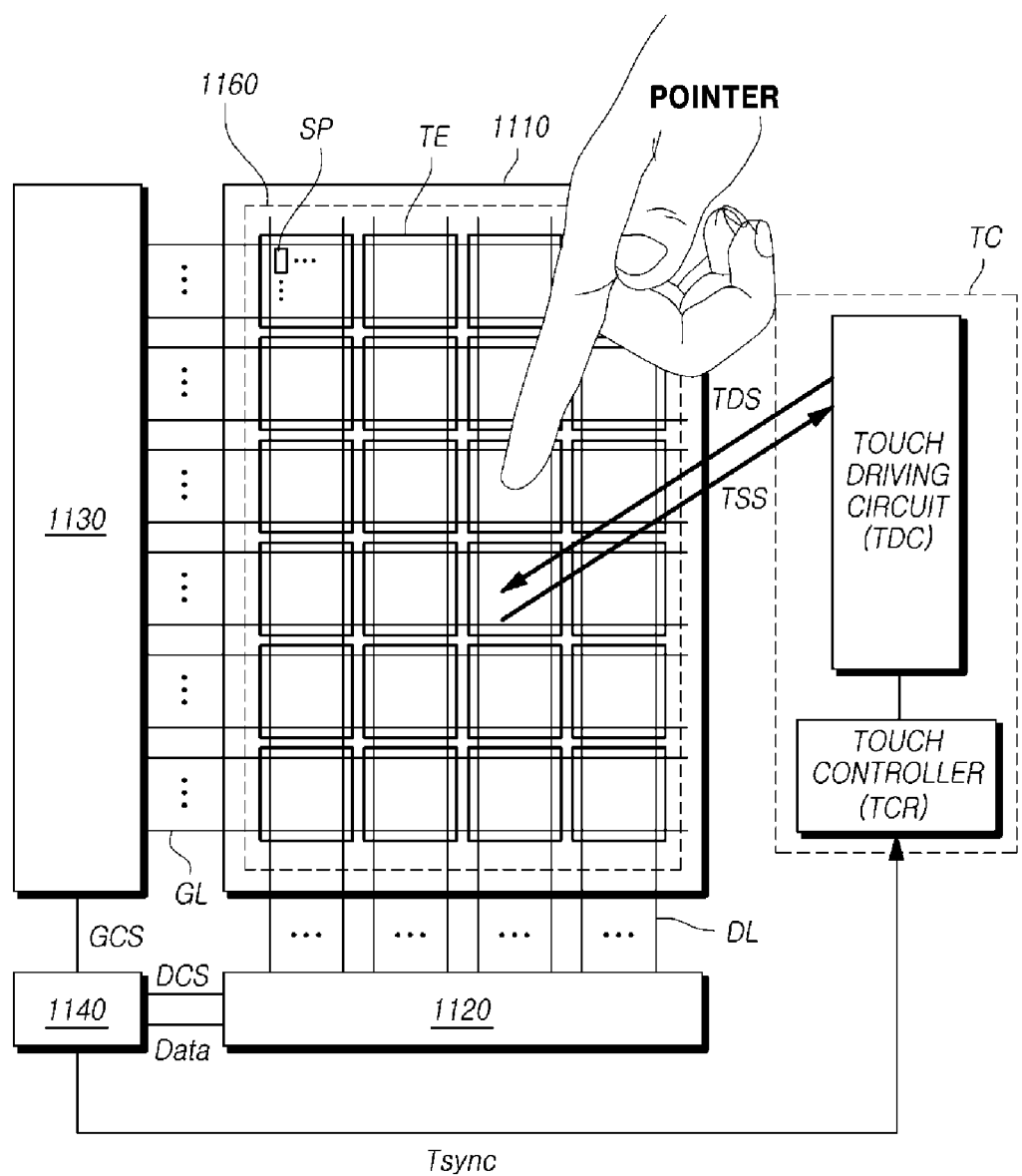
FIG. 11 is a block diagram illustrating a schematic system configuration of a touch display device according to aspects of the present disclosure.

FIG. 11 is a block diagram illustrating a schematic system configuration of a touch display device according to aspects of the present disclosure.

The touch display device 1100 of FIG. 11 includes a display panel 1110, a data driver 1120, a gate driver 1130, and a controller 1140, as in the display device 1000 of FIG. 10.

Also, the touch display device 1100 may include: a touch panel 1160 having multiple touch electrodes TE, which serve as a touch sensor for touch sensing, arranged therein; and a touch circuit TC configured to drive the touch panel 1160 during a touch interval, receive signals from the touch panel 1160, and perform touch sensing and pen touch sensing on the basis of the received signals.

The touch panel 1160 may be manufactured separately from the display panel 1110 and may be bonded to the display panel 1110, or may be mounted within the display panel 1110.

When the touch panel 1160 is mounted within the display panel 1110, the touch panel 1160 may be regarded as an aggregation of multiple touch electrodes TE and multiple touch lines TL.

When the multiple touch electrodes TE are mounted within the display panel 1110, the multiple touch electrodes TE may be arranged in an in-cell or on-cell type, and may be manufactured together with the display panel 1110.

During a touch interval defined by a touch synchronization signal Tsync received from the controller 140, the touch circuit TC may generate a touch driving signal TDS for driving the multiple touch electrodes TE, and may output the same to the touch electrodes TE.

The touch circuit TC may include: a touch driving circuit TDC configured to drive multiple touch electrodes TE; a touch controller TCR configured to determine whether there is a touch and/or the position of the touch, on the basis of signals received from touch electrodes TE to which a touch driving signal TDS is applied during a touch interval; and the like.

Also, the touch circuit TC according to aspects of the present disclosure may further include a spread spectrum clock generator SSCG as illustrated in FIG. 10.

The spread spectrum clock generator SSCG may receive an input clock signal CLKi from the controller 1140, and may output an output clock signal CLKo, a frequency of which is variable by frequency-modulating the received input clock signal CLKi, to the touch controller TCR, the touch driving circuit TDC, and the like.

When the controller 1140 already receives an output clock signal CLKo having a variable frequency as illustrated in FIG. 10, the touch circuit TC may not include a spread spectrum clock generator, and may receive an output clock signal CLKo delivered by the controller 1140 and may operate based on the same.

The touch controller TCR may be implemented to be mounted within the controller 1140 (or a timing controller).

The touch driving circuit TDC may be electrically connected to the multiple touch electrodes TE through multiple signal lines, and may supply a touch driving signal TDS to the multiple touch electrodes TE so as to drive the multiple touch electrodes TE.

Also, the touch driving circuit TDC may receive a touch sensing signal TSS from each of the touch electrodes TE to which a touch driving signal TDS is supplied.

The touch driving circuit TDC may deliver the received touch sensing signals TSS or sensing data TSD, obtained by signal-processing the received touch sensing signals TSS, to the touch controller TCR.

The touch controller TCR may execute a touch algorithm by using the touch sensing signal TSS or the sensing data TSD, and may determine whether there is a touch and/or the position of the touch, through the execution of the touch algorithm.

Although not illustrated, the touch display device 1100 may include a touch driving signal generator configured to generate a touch driving signal TDS. The touch driving signal generator may be disposed inside or outside the touch driving circuit TDC.

The touch driving signal generator may be disposed inside or outside the touch controller TCR. According to the circumstances, the touch driving signal generator may be implemented as a separate power controller integrated circuit.

The touch controller TCR may transmit a touch driving control signal during a touch interval, which is defined by a touch synchronization signal Tsync received from the controller 1140, to the touch driving signal generator and the touch driving circuit TDC.

Then, the touch driving signal generator may generate a touch driving signal TDS during a touch interval in response to the touch driving control signal, and may output the same to the touch driving circuit TDC.

The touch controller TCR according to aspects of the present disclosure may employ a self-capacitance-based touch sensing scheme for measuring a change in self-capacitance between each touch electrode TE and a pointer and detecting whether there is a touch and/or the position of the touch.

Alternatively, in the touch display device 1100 according to aspects of the present disclosure, the touch controller TCR may employ a mutual capacitance-based touch sensing scheme in which when multiple touch electrodes TE are divided into driving electrodes (may also be referred to as "touch driving electrodes or transmission (Tx) electrodes") and sensing electrodes (may also be referred to as "touch sensing electrodes or reception (Rx) electrodes") that are electrically separated from each other, a touch driving signal TDS is applied to the driving electrodes, and touch sensing signals TSS are received from the sensing electrodes, so as to detect whether there is a touch and/or the position of the touch, from a change in mutual capacitance between the touch driving electrodes and the sensing electrodes.

A ratio of a size of a touch electrode to a size of a sub-pixel may be adjusted by comprehensively considering touch sensing efficiency and performance, an influence on display that touch sensing exerts, and the like.

For example, in the touch display device 1100, common electrodes (Vcom electrodes) used during display driving may be grouped into multiple electrode blocks so as to be used as multiple touch electrodes TE.

The display panel 1110 may be implemented by various types of panels, including an LCD panel, an organic light-emitting display panel, and the like. As an example, when the display panel 1110 is implemented by an LCD panel, in the touch display device 1100, multiple common electrodes, to which a common voltage Vcom is applied and which generate electric fields with pixel electrodes, may be grouped into electrode blocks so as to be utilized as multiple touch electrodes TE.

Figure 12:
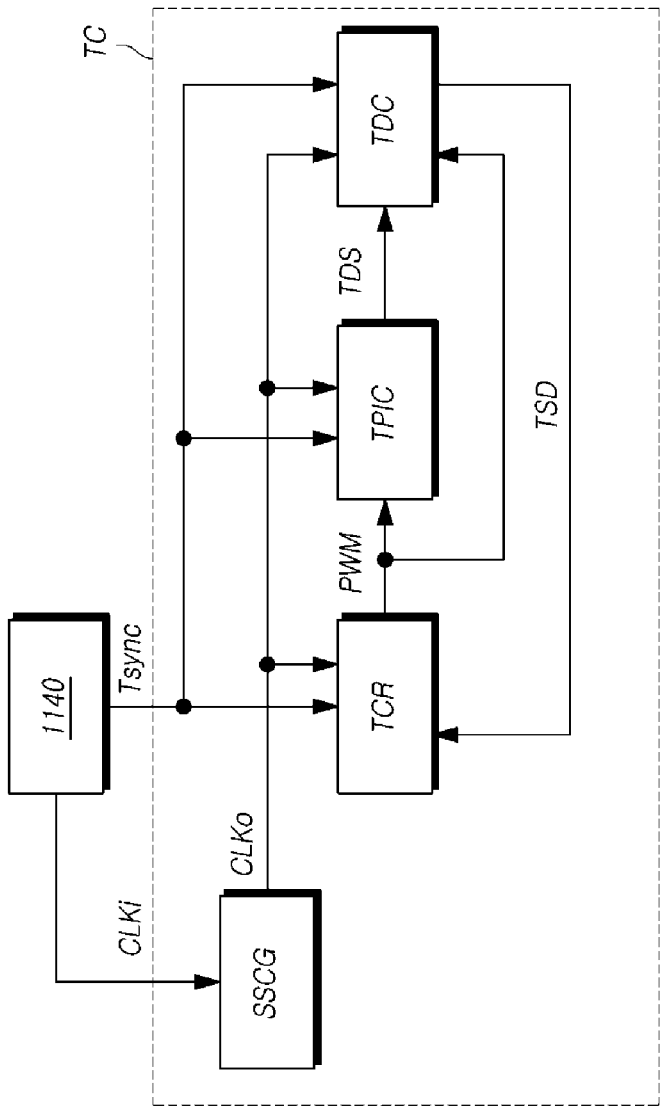
FIG. 12 is a block diagram illustrating a schematic configuration of a touch circuit according to aspects of the present disclosure.

FIG. 12 is a block diagram illustrating a schematic configuration of a touch circuit according to aspects of the present disclosure.

Referring to FIG. 12, the touch circuit TC may include a spread spectrum clock generator SSCG, a touch controller TCR, a touch driving signal generator TPIC, and a touch driver TDC.

The spread spectrum clock generator SSCG receives an input clock signal CLKi from the controller 1140, and outputs an output clock signal CLKo, a frequency of which is variable by frequency-modulating the received input clock signal CLKi, to the touch controller TCR, the touch driving signal generator TPIC, and the touch driver TDC.

In the present example, the spread spectrum clock generator SSCG, which includes the first modulator M1 and the second modulator N2, may generate a nested-modulation profile NMP, and may generate a nested-modulated output clock signal CLKo by modulating the input clock signal CLKi according to the nested-modulation profile NMP. The nested-modulation profile NMP causes a frequency of the output clock signal CLKo to be repeatedly increased or reduced by stages according to a variable target set value tg and a variable increasing/decreasing rate set value inc with reference to a predetermined center frequency $f_{cen}$. That is, this configuration makes it possible to reduce EMI.

Particularly, in aspects of the present disclosure, a nested-modulation profile NMP causes the area A of a triangle, which is defined by the variable first modulation ratio $c\delta_1(n)$ and the variable first modulation frequency $cf_{m1}(n)$ of an output clock signal CLKo with reference to a center frequency $f_{cen}$ in the time-frequency domain, to always be constant $(A=f_c \times c\delta_1(n)/8cf_{m1}(n))$, so that jitter is not increased and even when a frequency of the output clock signal CLKo is varied, it is possible to prevent an increase in the capacity of an FIFO memory, that is, an input buffer memory, of the touch controller TCR, the touch driving signal generator TPIC, and the touch driver TDC that receive the output clock signal CLKo.

In FIG. 12, a description will be made of a case in which the controller 1140 is considered to receive an input clock signal CLKi having an unvariable frequency and deliver the same to the touch circuit TC. However, when the controller 1140 receives an output clock signal CLKo of which a frequency is already varied as described above, the touch circuit TC may not include the spread spectrum clock generator SSCG.

The touch controller TCR receives the output clock signal CLKo from the spread spectrum clock generator SSCG, and receives a touch synchronization signal Tsync, which defines a touch interval TS, from the controller 1140.

In the present example, the touch synchronization signal Tsync may be a signal for distinguishing between and defining a display interval DS and a touch interval TS as described above, or may be a signal for defining only a touch interval TS regardless of a display interval DS.

The touch controller TCR may generate a touch driving generation signal PWM during a touch interval TS on the basis of the output clock signal CLKo according to the received touch synchronization signal Tsync, and may output the same to the touch driving signal generator TPIC and the touch driver TDC.

In the present example, the touch controller TCR may output, to the touch driver TDC, a touch driving generation signal PWM which is toggled by multiple times on the basis of the output clock signal CLKo during a touch interval TS defined by the touch synchronization signal Tsync.

Also, the spread spectrum clock generator SSCG may be implemented to be included in the touch controller TCR.

In this configuration, the touch controller TCR may simultaneously transmit the output clock signal CLKo to the touch driving signal generator TPIC and the touch driver TDC in order to synchronize operations of the touch driving signal generator TPIC and the touch driver TDC with the touch controller TCR of the touch circuit TC.

The touch driving signal generator TPIC generates a touch driving signal TDS according to the touch driving generation signal PWM, and outputs the same to the touch driver TDC.

That is, the touch driving generation signal PWM is a signal for generating a touch driving signal TDS, and may determine a frequency, a phase, and an amplitude of a touch driving signal TDS.

In the present example, the touch driving signal generator TPIC may generate a touch driving signal TDS having a signal waveform corresponding to that of the touch driving generation signal PWM.

As an example, the touch driving signal generator TPIC may generate a touch driving signal TDS having a frequency identical to that of the touch driving generation signal PWM. That is, the touch driving signal generator TPIC may generate a touch driving signal TDS which is toggled by the same times as the touch driving generation signal PWM during a touch interval TS.

In the present example, the touch driving signal generator TPIC may also generate a touch driving signal TDS on the basis of the output clock signal CLKo.

The touch driving signal TDS is provided to multiple touch electrodes TE so as to drive the multiple touch electrodes TE.

In this configuration, the touch driving signal generator TPIC may configured to receive a touch synchronization signal Tsync, and generate and output a touch driving signal TDS during only a touch interval TS according to the received touch synchronization signal Tsync.

The touch driver TDC drives the multiple touch electrodes TE by supplying the multiple touch electrodes TE with a touch driving signal TDS received during a touch interval TS according to the received touch synchronization signal Tsync.

When the multiple touch electrodes TE are driven, the touch driver TDC may sequentially drive the multiple touch electrodes TE such that one or more thereof are driven at a time, or may drive all of the multiple touch electrodes TE at once.

In the present example, the touch driver TDC may receive an output clock signal CLKo from the spread spectrum clock generator SSCG, and may receive a touch driving generation signal PWM from the touch controller TCR, so as to accurately determine timing at which a touch driving signal TDS is to be supplied to the multiple touch electrodes TE.

The touch electrode TE, to which a touch driving signal TDS is applied, may generate a parasitic capacitance Cp between itself and each of a data line DL, a gate line GL, and another touch electrode TE to which the touch driving signal TDS is not applied. Also, the parasitic capacitance Cp may serve as a load during touch sensing, and thus may become a main cause which reduces sensing accuracy.

Accordingly, when a touch driving signal TDS is applied to at least one touch electrode TE during a touch interval, the touch display device 1100 may apply the touch driving signal TDS or a signal corresponding to the touch driving signal TDS to multiple data lines DL, multiple gate lines GL, and all or some of the remaining touch electrodes TE.

In the present example, a signal corresponding to the touch driving signal TDS is referred to as a "load-free driving signal LFDS", and a load-free driving scheme may refer to a driving scheme for preventing the occurrence of a parasitic capacitance Cp by applying a load-free driving signal LFDS to multiple data lines DL, multiple gate lines GL, and all or some of the remaining touch electrodes TE.

The load-free driving signal LFDS may be a signal which is completely identical or substantially identical to a touch driving signal TDS. Alternatively, when the load-free driving signal LFDS is capable of removing or reducing a parasitic capacitance between a touch electrode TE, which is a touch sensing target electrode TE, and another electrode, the load-free driving signal LFDS may be a signal which is different from or similar to the touch driving signal TDS.

The touch driver TDC receives a touch sensing signal TSS from each touch electrode TE to which the touch driving signal TDS is supplied, and delivers the received touch sensing signals TSS or sensing data TSD, obtained by signal-processing the received touch sensing signals TSS, to the touch controller TCR through a pre-designated interface.

By this configuration, the touch controller TCR may execute a touch algorithm by using the touch sensing signals TSS or the sensing data TSD, and may detect whether there is a touch and/or the position of the touch through the execution of the touch algorithm.

As described above, the touch display device 1100 according to aspects of the present disclosure: may include the touch circuit TC including the spread spectrum clock generator SSCG; may generate an output clock signal CLKo having a variable frequency; may cause the touch controller TCR of the touch circuit TC, the touch driving signal TPIC, and the touch driver TDC to perform operations on the basis of the output clock signal CLKo; and thus, can suppress the occurrence of EMI when the touch display device 1100 drives touch electrodes TE by using a touch driving signal TDS having a high frequency for touch sensing.

In addition, even when EMI is reduced, the touch display device 1100: can prevent an increase in the capacity of an input buffer memory of each of the touch controller TCR, the touch driving signal generator TPIC, and the touch driver TDC that receive the output clock signal CLKo; and can prevent an increase in jitter.

The above description and the accompanying drawings are merely provided as an example of the technical idea of the present disclosure, and those having ordinary knowledge in the technical field to which the present disclosure pertains will appreciate that various modifications and changes in form, such as combination, separation, substitution, and change of a configuration, may be made to the aspects described herein without departing from the essential features of the present disclosure. Therefore, the aspects disclosed in the present disclosure are intended not to limit but to describe the technical idea of the present disclosure, and thus do not limit the scope of the technical idea of the present disclosure. The scope of the present disclosure should be construed based on the appended claims, and all of the technical ideas included within the scope equivalent to the appended claims should be construed as being included within the scope of the present disclosure.

What is claimed is:

1. A spread spectrum clock generation apparatus comprising:
    a frequency modulator configured to generate an output clock signal having a variable frequency with respect to a predetermined center frequency by frequency-modulating the input clock signal according to a modulation profile signal; and
    a profile generator configured to generate a nested-modulation profile for controlling the frequency of the output clock signal, generate the modulation profile signal according to the nested-modulation profile, and output the modulation profile signal to the frequency modulator,
    wherein the profile generator is further configured to generate the nested-modulation profile by varying a cycle and a change range of a triangle modulation profile having a triangle waveform pattern having a pre-designated cycle and a pre-designated amplitude with respect to the center frequency in a time-frequency domain,
    wherein the profile generator comprises:
    a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile;
    a register configured to pre-store the center frequency set value, an initial target set value, and an initial increasing/decreasing rate set value;
    a second modulator configured to generate a step index according to a pre-designated scheme in response to the flag signal, and calculate the target set value and the increasing/decreasing rate set value by using the step index, the initial target set value, and the initial increasing/decreasing rate set value; and
    a sigma-delta modulator configured to generate the modulation profile signal for controlling the frequency of the output clock signal according to the nested-modulation profile,
    wherein the first modulator is configured to receive, from the frequency modulator, a divided clock signal obtained by dividing the output clock signal according to a division ratio designated by the modulation profile signal and in response to the divided clock signal, sequentially increase/reduce the nested-modulation profile according to a frequency interval designated by the increasing/decreasing rate set value in a range of a maximum frequency and a minimum frequency designated by the target set value from the center frequency in the time-frequency domain.

2. The spread spectrum clock generation apparatus of claim 1, wherein the nested-modulation profile has a cycle and a change range which are inversely proportional to each other such that an area of a triangle is constant,
    wherein the area of the triangle is defined by the cycle and the change range that are variable with respect to the center frequency in the time-frequency domain.

3. The spread spectrum clock generation apparatus of claim 2, wherein the nested-modulation profile has a cycle and a change range which are sequentially increased or reduced in a pre-designated pattern.

4. The spread spectrum clock generation apparatus of claim 2, wherein the nested-modulation profile has a pattern in which a cycle and a change range are randomly variable.

5. The spread spectrum clock generation apparatus of claim 1, wherein the frequency modulator includes:
    a fractional-N Phase-Locked Loop (PLL) configured to divide the output clock signal according to a division ratio designated by the modulation profile signal, and vary and output the frequency of the output clock signal according to a phase difference between the divided output clock signal and the input clock signal.

6. The spread spectrum clock generation apparatus of claim 1, wherein the frequency modulator includes:
    a divider configured to divide the output clock signal according to a division ratio designated by the modulation profile signal, and output a divided clock signal;
    a phase frequency detector configured to receive the input clock signal and the divided clock signal, and output a phase difference signal representing a phase difference between the input clock signal and the divided clock signal;
    a charge pump configured to generate and output a current signal corresponding to the phase difference signal;
    a loop filter configured to generate a voltage control signal corresponding to the current signal; and
    a voltage-controlled oscillator configured to adjust and output the frequency of the output clock signal according to the voltage control signal.

7. A spread spectrum clock generation apparatus comprising:
    a frequency modulator configured to generate an output clock signal having a variable frequency with respect to a predetermined center frequency by frequency-modulating the input clock signal according to a modulation profile signal; and
    a profile generator configured to generate a nested-modulation profile for controlling the frequency of the output clock signal, generate the modulation profile signal according to the nested-modulation profile, and output the modulation profile signal to the frequency modulator,
    wherein the profile generator is further configured to generate the nested-modulation profile by varying a cycle and a change range of a triangle modulation profile having a triangle waveform pattern having a pre-designated cycle and a pre-designated amplitude with respect to the center frequency in a time-frequency domain,
    wherein the profile generator comprises:
    a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile;
    a register configured to pre-store the center frequency set value, an initial target set value, and an initial increasing/decreasing rate set value;
    a second modulator configured to generate a step index according to a pre-designated scheme in response to the flag signal, and calculate the target set value and the increasing/decreasing rate set value by using the step index, the initial target set value, and the initial increasing/decreasing rate set value; and a sigma-delta modulator configured to generate the modulation profile signal for controlling the frequency of the output clock signal according to the nested-modulation profile, wherein the second modulator includes:
a step index generator configured to generate the step index in response to the flag signal;
a nested-modulation rate calculator configured to calculate a nested-modulation rate by using the step index and an initial second modulation value pre-stored in the register, and calculate a nested slope from the nested-modulation rate;
a first multiplier configured to calculate the target set value by using the nested-modulation rate and the initial target set value; and
a second multiplier configured to calculate the increasing/decreasing rate set value by using the nested slope and the initial increasing/decreasing rate set value.

8. The spread spectrum clock generation apparatus of claim 7, wherein the step index generator includes:
an up/down counter configured to sequentially increase/reduce and output the step index in a range within the pre-designated maximum number of steps when the flag signal is received; and
a Pseudo-Random Binary Sequence (PRBS) generator configured to randomly select and output the step index in the range within the maximum number of the steps when the flag signal is received.

9. The spread spectrum clock generation apparatus of claim 8, wherein the second modulator further comprises a step index selector configured to select one of respective step indices, which are output from the up/down counter and the Pseudo-Random Binary Sequence generator, according to a selection signal stored in the register; and output the selected step index to the nested-modulation rate calculator when the step index generator includes both the up/down counter and the Pseudo-Random Binary Sequence generator.

10. The spread spectrum clock generation apparatus of claim 8, wherein the up/down counter is configured to receive a step interval from the register, and uniformly or differentially increase/reduce the step index according to the step interval when the flag signal is received.

11. A method for generating a spread spectrum clock by a spread spectrum clock generation apparatus, comprising:
generating a nested-modulation profile having a pattern in which, in a time-frequency domain, a cycle and a change range of a triangle modulation profile having a triangle waveform pattern with respect to a predetermined center frequency are variable; and
generating an output clock signal, a frequency of which is variable with reference to the center frequency, by frequency-modulating an input clock signal according to the nested-modulation profile,
wherein the nested-modulation profile has a cycle and a change range which are inversely proportional to each other such that an area of a triangle is constant, wherein the area of the triangle is defined by the cycle and the change range that are variable with respect to the center frequency in the time-frequency domain,
wherein the nested-modulation profile is generated by a profile generator, the profile generator comprises:
a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile;
a register configured to pre-store the center frequency set value, an initial target set value, and an initial increasing/decreasing rate set value;
a second modulator configured to generate a step index according to a pre-designated scheme in response to the flag signal, and calculate the target set value and the increasing/decreasing rate set value by using the step index, the initial target set value, and the initial increasing/decreasing rate set value; and
a sigma-delta modulator configured to generate the modulation profile signal for controlling the frequency of the output clock signal according to the nested-modulation profile,
wherein the first modulator is configured to receive, from the frequency modulator, a divided clock signal obtained by dividing the output clock signal according to a division ratio designated by the modulation profile signal and in response to the divided clock signal, sequentially increase/reduce the nested-modulation profile according to a frequency interval designated by the increasing/decreasing rate set value in a range of a maximum frequency and a minimum frequency designated by the target set value from the center frequency in the time-frequency domain.

12. A display device comprising:
a display panel in which multiple sub-pixels defined by multiple data lines and multiple gate lines are arranged;
a data driver configured to drive the multiple data lines;
a gate driver configured to drive the multiple gate lines;
a spread spectrum clock generator configured to generate a nested-modulation profile having a pattern in which, in a time-frequency domain, a cycle and a change range of a triangle modulation profile having a triangle waveform pattern with respect to a predetermined center frequency are variable, and
generate an output clock signal, a frequency of which is variable with respect to the center frequency, by frequency-modulating an input clock signal according to the nested-modulation profile; and
a controller configured to receive the output clock signal, and control the data driver and the gate driver according to the output clock signal,
wherein the nested-modulation profile has a cycle and a change range which are inversely proportional to each other such that an area of a triangle is constant, wherein the area of the triangle is defined by the cycle and the change range that are variable with respect to the center frequency in the time-frequency domain,
wherein the nested-modulation profile is generated by a profile generator, the profile generator comprises:
a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile;
a register configured to pre-store the center frequency set value, an initial target set value, and an initial increasing/decreasing rate set value;
a second modulator configured to generate a step index according to a pre-designated scheme in response to the flag signal, and calculate the target set value and the increasing/decreasing rate set value by using the step index, the initial target set value, and the initial increasing/decreasing rate set value; and a sigma-delta modulator configured to generate the modulation profile signal for controlling the frequency of the output clock signal according to the nested-modulation profile, wherein the first modulator is configured to receive, from the frequency modulator, a divided clock signal obtained by dividing the output clock signal according to a division ratio designated by the modulation profile signal and in response to the divided clock signal, sequentially increase/reduce the nested-modulation profile according to a frequency interval designated by the increasing/decreasing rate set value in a range of a maximum frequency and a minimum frequency designated by the target set value from the center frequency in the time-frequency domain.

13. The display device of claim 12, wherein the controller includes the spread spectrum clock generator.

14. A touch display device comprising:

a touch panel having multiple touch electrodes arranged therein; and a touch circuit configured to output a pulse-type touch driving signal to the touch panel according to a touch synchronization signal which defines a touch interval for touch sensing, and sense whether there is a touch or a position of the touch, wherein the touch circuit comprises:

a spread spectrum clock generator configured to generate a nested-modulation profile having a pattern in which, in a time-frequency domain, a cycle and a change range of a triangle modulation profile having a triangle waveform pattern with reference to a predetermined center frequency are variable, and generate an output clock signal, a frequency of which is variable with reference to the center frequency, by frequency-modulating an input clock signal according to the nested-modulation profile;

a touch driver configured to drive one or more touch electrodes among the multiple touch electrodes by supplying the one or more touch electrodes thereamong with the touch driving signal during the touch interval on the basis of the output clock signal, and acquire sensing data by signal-processing touch sensing signals sensed from the driven touch electrodes;

a touch controller configured to generate a touch driving generation signal for generating the touch driving signal on the basis of the output clock signal, and receive the sensing data so as to sense whether there is a touch or a position of the touch; and a touch driving signal generator configured to generate the touch driving signal according to the touch driving generation signal, and output the touch driving signal to the touch driver, wherein the nested-modulation profile has a cycle and a change range which are inversely proportional to each other such that an area of a triangle is constant, wherein the area of the triangle is defined by the cycle and the change range that are variable with respect to the center frequency in the time-frequency domain, wherein the nested-modulation profile is generated by a profile generator, the profile generator comprises:

a first modulator configured to receive a center frequency set value, designating the center frequency, and an increasing/decreasing rate set value and a target set value, designating a variable cycle and a variable change range of the nested-modulation profile, so as to generate the nested-modulation profile, and output a flag signal at every cycle of the nested-modulation profile;

a register configured to pre-store the center frequency set value, an initial target set value, and an initial increasing/decreasing rate set value;

a second modulator configured to generate a step index according to a pre-designated scheme in response to the flag signal, and calculate the target set value and the increasing/decreasing rate set value by using the step index, the initial target set value, and the initial increasing/decreasing rate set value; and a sigma-delta modulator configured to generate the modulation profile signal for controlling the frequency of the output clock signal according to the nested-modulation profile, wherein the first modulator is configured to receive, from the frequency modulator, a divided clock signal obtained by dividing the output clock signal according to a division ratio designated by the modulation profile signal and in response to the divided clock signal, sequentially increase/reduce the nested-modulation profile according to a frequency interval designated by the increasing/decreasing rate set value in a range of a maximum frequency and a minimum frequency designated by the target set value from the center frequency in the time-frequency domain.

15. The touch display device of claim 14, wherein the touch controller includes the spread spectrum clock generator.

\* \* \* \* \*